US012135882B2

(12) United States Patent
Jeong et al.

(10) Patent No.: US 12,135,882 B2
(45) Date of Patent: Nov. 5, 2024

(54) MEMORY DEVICE AND METHOD OF OPERATING THE SAME

(71) Applicant: SK hynix Inc., Icheon-si (KR)

(72) Inventors: Chan Hui Jeong, Icheon-si (KR); Hyung Jin Choi, Icheon-si (KR); Se Chun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 159 days.

(21) Appl. No.: 17/968,083

(22) Filed: Oct. 18, 2022

(65) Prior Publication Data
US 2023/0393759 A1    Dec. 7, 2023

(30) Foreign Application Priority Data

Jun. 2, 2022 (KR) ........................ 10-2022-0067421

(51) Int. Cl.
*G11C 16/08* (2006.01)
*G06F 3/06* (2006.01)
*G11C 29/50* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC .... G06F 3/0619; G06F 3/0653; G06F 3/0679; G11C 2029/1202; G11C 29/50; G11C 29/50004; G11C 29/025; G11C 16/08; G11C 16/10; G11C 16/3404; G11C 16/3459
See application file for complete search history.

(56) References Cited

U.S. PATENT DOCUMENTS

| 9,082,487 | B2* | 7/2015 | Koo ........................ G11C 16/10 |
| 2008/0130363 | A1* | 6/2008 | Hosono ............. G11C 16/3418 365/185.33 |
| 2014/0269079 | A1* | 9/2014 | Kamigaichi ........... G11C 16/10 365/185.24 |
| 2019/0108883 | A1* | 4/2019 | Yu .......................... G11C 16/08 |
| 2019/0156896 | A1* | 5/2019 | Park ....................... G11C 16/32 |

FOREIGN PATENT DOCUMENTS

| KR | 1020150091665 A | 8/2015 |
| KR | 102116674 B1 | 6/2020 |
| KR | 1020210062502 A | 5/2021 |

* cited by examiner

*Primary Examiner* — Hien N Nguyen
(74) *Attorney, Agent, or Firm* — WILLIAM PARK & ASSOCIATES LTD.

(57) ABSTRACT

A memory device, and a method of operating the same, includes a plurality of memory cells coupled to a plurality of word lines, a peripheral circuit configured to perform a program operation of storing data in the plurality of memory cells, a weak word line information storage configured to store information about a weak word line among the plurality of word lines, and a program operation controller configured to control the peripheral circuit such that the program operation is performed in a first program mode or a second program mode depending on a result of determining whether a selected word line corresponding to an address provided from a memory controller is a weak word line by comparing word lines based on the information about the weak word line.

20 Claims, 19 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0067421, filed on Jun. 2, 2022, in the Korean Intellectual Property Office, the entire disclosure of which is incorporated herein by reference.

BACKGROUND

1. Technical Field

Various embodiments of the present disclosure relate to an electronic device, and more particularly, to a memory device and a method of operating the memory device.

2. Related Art

A memory system is a device which stores data under the control of a host device such as a computer or a smartphone. The memory system may include a memory device in which data is stored and a memory controller which controls the memory device. Memory devices are classified as volatile memory devices or a nonvolatile memory devices.

In nonvolatile memory devices, stored data is retained even when supplied power is interrupted. Examples of nonvolatile memory devices may include read only memory (ROM), programmable ROM (PROM), electrically programmable ROM (EPROM), electrically erasable and programmable ROM (EEPROM), and flash memory.

Nonvolatile memory devices include memory cells which store data. The data stored in the memory cells may be separated depending on the degree to which the threshold voltages of the memory cells are increased. In a three-dimensional (3D) memory cell structure, the characteristics of memory cells may be different from each other depending on the locations of the memory cells. When the characteristics of the memory cells are different from each other, the degrees to which the threshold voltages of the memory cells are increased may also be different from each other, even if the same voltage is applied to the memory cells. Accordingly, the magnitudes, times, etc. of voltages applied during a program operation of storing data in the memory cells may be set differently depending on the characteristics of the memory cells.

SUMMARY

Various embodiments of the present disclosure are directed to a memory device that is capable of improving the threshold voltage distributions of memory cells during a program operation, and a method of operating the memory device.

An embodiment of a memory device in accordance with the present disclosure may include a plurality of memory cells coupled to a plurality of word lines, a peripheral circuit configured to perform a word line test operation of determining a weak word line among the plurality of word lines, and a weak word line determiner. The weak word line determiner may be configured to control the peripheral circuit such that a result, obtained by comparing a number of first off-cells identified through a first pre-program operation with a number of second off-cells identified through a second pre-program operation, is stored in any one memory block during the word line test operation. The first pre-program operation is an operation of applying a precharge voltage to a source line coupled in common to the plurality of memory cells and thereafter applying a pre-program voltage to a selected word line, among the plurality of word lines. The second pre-program operation is an operation of applying a ground voltage to the source line and thereafter applying the pre-program voltage to the selected word line.

An embodiment of a memory device in accordance with the present disclosure may include a plurality of memory cells coupled to a plurality of word lines, a peripheral circuit configured to perform a program operation of storing data in the plurality of memory cells, a weak word line information storage configured to store information about a weak word line among the plurality of word lines, and a program operation controller. The program operation controller may be configured to control the peripheral circuit such that the program operation is performed in a first program mode or a second program mode depending on a result of determining whether a selected word line corresponding to an address provided from a memory controller is a weak word line by comparing word lines based on the information about the weak word line. The information about the weak word line includes information determined by comparing a first pre-program operation with a second pre-program operation, wherein the first pre-program operation is an operation of applying a precharge voltage to a source line coupled in common to the plurality of memory cells and increasing threshold voltages of the plurality of memory cells, and the second pre-program operation is an operation of applying a ground voltage to the source line and increasing threshold voltages of the plurality of memory cells.

A method of operating a memory device in accordance with the present disclosure may include determining, based on information about a weak word line, whether a selected word line corresponding to an address provided from a memory controller is a weak word line by comparing the selected word line with the weak word line. The method may also include determining a program mode to be any one of a first program mode and a second program mode based on a result of the comparison, and performing a program operation of storing data in selected memory cells coupled to the selected word line based on the one program mode. The information about the weak word line includes information determined by comparing a first pre-program operation of applying a precharge voltage to a source line coupled in common to the plurality of memory cells and increasing threshold voltages of the plurality of memory cells with a second pre-program operation of applying a ground voltage to the source line and increasing threshold voltages of the plurality of memory cells.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Figure 1:
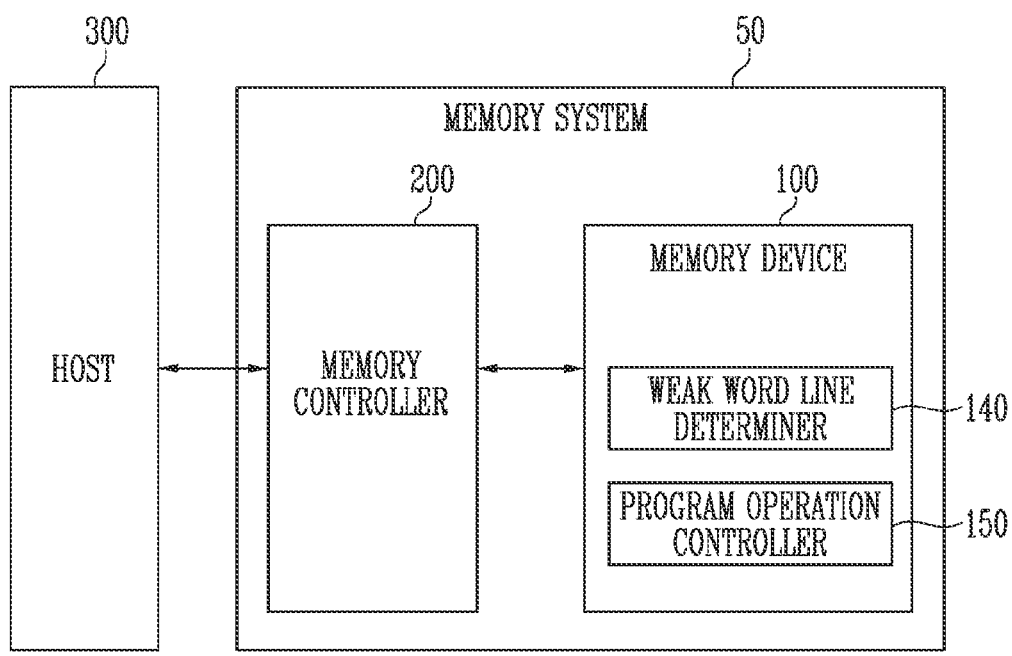
FIG. 1 is a block diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device which stores data under the control of a host 300, such as a mobile phone, a smartphone, an MP3 player, a laptop computer, a desktop computer, a game console, a TV, a tablet PC, or an in-vehicle infotainment system.

The memory system 50 may be manufactured as any one of various types of storage devices depending on a host interface that is a scheme for communication with the host 300. For example, the memory system 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The memory system 50 may be manufactured in any one of various types of package forms. For example, the memory system 50 may be manufactured in any one of various types of package forms, such as package on package (POP), system in package (SIP), system on chip (SOC), mufti-chip package (MCP), chip on board (COB), wafer-level fabricated package (WFP), and wafer-level stack package (WSP).

The memory device 100 may store data. The memory device 100 may be operated under the control of the memory controller 200. The memory device 100 may include a memory cell array (not illustrated) including a plurality of memory cells which store data.

Each of the memory cells may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The memory cell array (not illustrated) may include a plurality of memory blocks. Each memory block may include a plurality of memory cells. One memory block may include a plurality of pages. In an embodiment, a page may be the unit by which data is stored in the memory device 100 or the unit by which data stored in the memory device 100 is read. A memory block may be the unit by which data is erased.

In an embodiment, memory of the memory device 100 may be implemented as double data rate synchronous dynamic random access memory (DDR SDRAM), low power double data rate fourth generation (LPDDR4) SDRAM, graphics double data rate (GDDR) SDRAM, low power DDR (LPDDR) SDRAM, Rambus dynamic random access memory (RDRAM), NAND flash memory, vertical NAND flash memory, NOR flash memory, resistive RAM (RRAM), phase-change RAM (PRAM), magnetoresistive RAM (MRAM), ferroelectric RAM (FRAM), or spin transfer torque RAM (STT-RAM). For convenience of description, in the present specification, a description is made on the assumption that the memory device 100 uses NAND flash memory.

The memory device 100 may receive a command and an address from the memory controller 200, and may access the area of the memory cell array, selected by the address. The memory device 100 may perform an operation indicated by the command on the area selected by the address. For example, the memory device 100 may perform a write operation (i.e., a program operation), a read operation, and an erase operation. During a write operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may include a weak word line determiner 140 and a program operation controller 150.

The weak word line determiner 140 may determine the characteristics of each word line coupled to the memory cells. The memory cells may have different characteristics depending on the production or manufacturing process thereof. Further, in a 3D memory cell structure, the characteristics of memory cells may be different from each other depending on the locations of the memory cells. The degrees to which memory cells are influenced by voltages applied to the word lines may be different from each other depending on the characteristics of the memory cells. In detail, the degrees to which the threshold voltages of the memory cells are varied due to the voltages applied to the word lines may be different from each other; In an embodiment, the weak word line determiner 140 may determine a word line coupled to memory cells for which the degrees to which threshold voltages are varied are high, among the memory cells, to be a weak word line. For example, during a program operation, the degree to which the threshold voltages of the memory cells coupled to the weak word line are increased may be greater than those of memory cells coupled to other word lines. The weak word line determiner 140 may store information about each weak word line (i.e., weak word line information), which is information obtained by determining each weak word line, among a plurality of word lines. A detailed operation of the weak word line determiner 140 will be described later with reference to FIGS. 6 and 7.

The program operation controller 150 may control a program operation performed on memory cells. The program operation may be an operation of storing data in the memory cells. In detail, the program operation may be an operation of increasing the threshold voltages of memory cells depending on the data to be stored in the memory cells. When the program operation is performed, each of the memory cells may have a threshold voltage corresponding to any one of a plurality of program states. The plurality of program states may be defined depending on the number of data bits stored in one memory cell. For example, when data is programmed in a triple-level cell (TLC) scheme in which three bits of data are stored in one memory cell, the plurality of program states may indicate an erased state and first to seventh program states. After the program operation has been performed, the threshold voltages of the memory cells may be determined depending on the data to be stored in the memory cells. Each of the memory cells may have any one of the plurality of program states as a target program state depending on the data to be stored in the corresponding memory cell.

In an embodiment, the program operation may include a plurality of program loops. Each program loop may include a program voltage apply operation and a verify operation. The program voltage apply operation may be an operation of increasing the threshold voltages of memory cells using a program voltage. The verify operation may be an operation of identifying, using a verify voltage, whether the threshold voltages of the memory cells have reached threshold voltages corresponding to a target program state.

In an embodiment, the program operation controller 150 may perform the program operation in any one of a first program mode or a second program mode based on the weak word line information. In the first program mode and the second program mode, the magnitudes of voltages applied in the program operation may be different from each other. In an example, when the word line corresponding to an address input from the memory controller 200 is a weak word line, the program operation controller 150 may perform the program operation in the first program mode. In an example, when the word line corresponding to an address input from the memory controller 200 is a normal word line, the program operation controller 150 may perform the program operation in the second program mode.

The memory controller 200 may control the overall operation of the memory system 50.

When power is applied to the memory system 50, the memory controller 200 may run firmware (FW). When the memory device 100 is a flash memory device, the firmware (FW) may include a host interface layer (HIL) which controls communication with the host 300, a flash translation layer (FTL) which controls communication between the host 300 and the memory device 100, and a flash interface layer (FIL) which controls communication with the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. In the present specification, the terms "logical block address (LBA)" and "logical address" may be used interchangeably. In the present specification, the physical block address (PBA) and "physical address" may be used interchangeably.

The memory controller 200 may control the memory device 100 so that a write operation, a read operation, or an erase operation is performed in response to a request received from the host 300. During a write operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may internally generate a command, an address, and data regardless of whether a request from the host 300 is received, and may transmit them to the memory device 100. For example, the memory controller 200 may provide the memory device 100 with commands, addresses, and data required in order to perform read operations and write operations that are involved in performing wear leveling, read reclaim, garbage collection, etc.

In an embodiment, the memory controller 200 may control two or more memory devices 100. In this case, the memory controller 200 may control the memory devices 100 depending on an interleaving scheme to improve operating performance. The interleaving scheme may be a scheme for controlling the memory devices 100 so that the operations of at least two memory devices 100 are caused to overlap each other.

The host 300 may communicate with the memory system 50 using at least one of various communication methods such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

In an embodiment, the memory system 50 may include buffer memory (not illustrated). For example, the buffer memory may temporarily store data received from the host 300 or data received from the memory device 100, or may temporarily store metadata (e.g., mapping tables) of the memory device 100. The buffer memory may include volatile memory, such as DRAM, SDRAM, DDR SDRAM, LPDDR SDRAM, and GRAM, or nonvolatile memory, such as FRAM, ReRAM, STT-MRAM, and PRAM.

Figure 2:
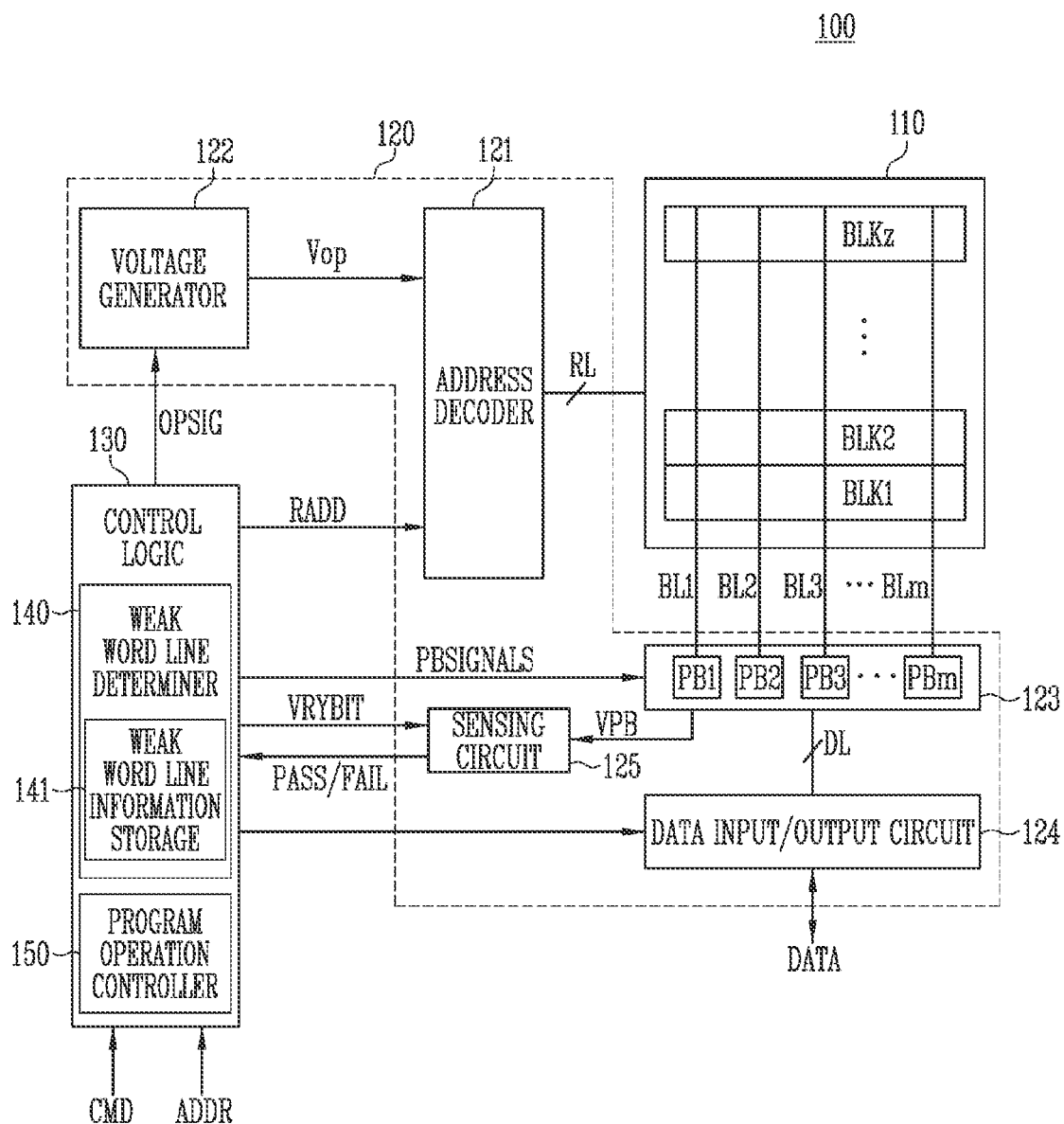
FIG. 2 is a block diagram illustrating the structure of the memory device of FIG. 1.

FIG. 2 is a diagram illustrating the structure of the memory device 100 of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz may be coupled to an address decoder 121 through row lines RL. The memory blocks BLK1 to BLKz are coupled to a page buffer group 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 may include a plurality of pages. In an embodiment of the present disclosure, each of the memory blocks BLK1 to BLKz included in the memory cell array 110 may include a plurality of dummy cells. For the dummy cells, one or more dummy cells may be coupled in series between a drain select transistor and memory cells and between a source select transistor and the memory cells.

Each of the memory cells of the memory device 100 may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The peripheral circuit 120 may drive the memory cell array 110. In an example, the peripheral circuit 120 may drive the memory cell array 110 so that a program operation, a read operation, and an erase operation are performed under the control of the control logic 130. In an example, the peripheral circuit 120 may apply various operating voltages to the row lines RL and the bit lines BL1 to BLm or discharge the applied voltages under the control of the control logic 130.

In an embodiment the peripheral circuit 120 may include the address decoder 121, a voltage generator 122, the page buffer group 123, a data input/output circuit 124, and a sensing circuit 125.

The address decoder 121 is coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 receives addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address RADD, among the received addresses ADDR. The address decoder 121 may select at least one word line WL of the selected memory block by applying voltages supplied from the voltage generator 122 to the at least one word line WL according to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to unselected word lines.

During a read operation, the address decoder 121 may apply a read voltage to the selected word line and apply a read pass voltage having a level higher than that of the read voltage to unselected word lines.

The erase operation of the memory device 100 is performed on a memory block basis. During the erase operation, the addresses ADDR input to the memory device 100 include a block address. The address decoder 121 may decode the block address and select one memory block according to the decoded block address. During the erase operation, the address decoder 121 may apply a ground voltage to word lines coupled to the selected memory block.

The address decoder 121 may decode a column address among the received addresses ADDR. The decoded column address may be transferred to the page buffer group 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 may be used as an operating voltage for the memory device 100.

In an embodiment, the voltage generator 122 may generate various operating voltages Vop that are used for program, read, and erase operations in response to an operation signal OPSIG. The voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The page buffer group 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm may transmit/receive data DATA to/from the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. The memory cells in a selected page are programmed based on the received data DATA. Memory cells coupled to a bit line to which a program enable voltage (e.g., a ground voltage) is applied may have increased threshold voltages. The threshold voltages of memory cells coupled to a bit line to which a program-inhibit voltage (e.g., a supply voltage) is applied may be maintained. During a program verify operation, the first to m-th page buffers PB1 to PBm may read the data DATA stored in the selected memory cells from the selected memory cells through the bit lines BL1 to BLm.

During a read operation, the page buffer group 123 may read data DATA from the memory cells in the selected page through the bit lines BL1 to BLm, and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data stored in some of the plurality of page buffers included in the page buffer group 123 are being programmed to the memory cell array 110, the remaining page buffers may receive new data from the memory controller 200 and then store the new data.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the page buffer group 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the page buffer group 123 with a reference voltage generated by the reference current. In an example, the sensing circuit 125 may output a pass signal to the control logic 130 when the magnitude of the sensing voltage VPB is less than that of the reference voltage. In an example, the sensing circuit 125 may output a fail signal to the control logic 130 when the magnitude of the sensing voltage VPB is less than that of the reference voltage.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD transferred from an external device. The control logic 130 may be implemented as hardware, software, or a combination of hardware and software. For example, the control logic 130 may be a control logic circuit operating in accordance with an algorithm and/or a processor executing control logic code.

The control logic 130 may control the peripheral circuit 120 by generating various types of signals in response to the command CMD and addresses ADDR. For example, the control logic 130 may generate an operation signal OPSIG, the row address RADD, page buffer control signals PBSIGNALS, and the enable bit VRYBIT in response to the command CMD and the addresses ADDR. The control logic 130 may output the operation signal OPSIG to the voltage generator 122, may output the row address RADD to the address decoder 121, may output the page buffer control signals PBSIGNALS to the page buffer group 123, and may output the enable bit VRYBIT to the sensing circuit 125. In addition, the control logic 130 may determine whether a verify operation has passed or failed in response to the pass or fail signal PASS or FAIL output from the sensing circuit 125.

The weak word line determiner 140 and the program operation controller 150 illustrated in FIG. 1 may be included in the control logic 130 illustrated in FIG. 2.

The weak word line determiner 140 may control the peripheral circuit 120 so that a word line test operation of determining a weak word line, among a plurality of word lines, is performed. The word line test operation may include a first pre-program operation and a second pre-program operation. The first pre-program operation may be an operation of increasing the threshold voltages of memory cells by applying a precharge voltage to a common source line coupled to the memory cells and applying a pre-program voltage to a word line coupled to the memory cells. The second pre-program operation may be an operation of increasing the threshold voltages of memory cells by applying a ground voltage to the common source line coupled to the memory cells and applying a pre-program voltage to the word line coupled to the memory cells.

The weak word line determiner 140 may determine the corresponding word line coupled to the memory cells to be a weak word line based on the result of a comparison between the degree to which the threshold voltages of the memory cells are increased through the first pre-program operation and the degree to which the threshold voltages of the memory cells are increased through the second pre-program operation. The weak word line determiner 140 may store weak word line information, which is information obtained by determining each weak word line, among the plurality of word lines.

The program operation controller 150 may control the peripheral circuit 120 so that a program operation is performed on the memory cells. The program operation controller 150 may control the peripheral circuit 120 so that operating voltages glop to be used in the program operation are applied to the row lines RL and the bit lines BL1 to BLm.

Figure 3:
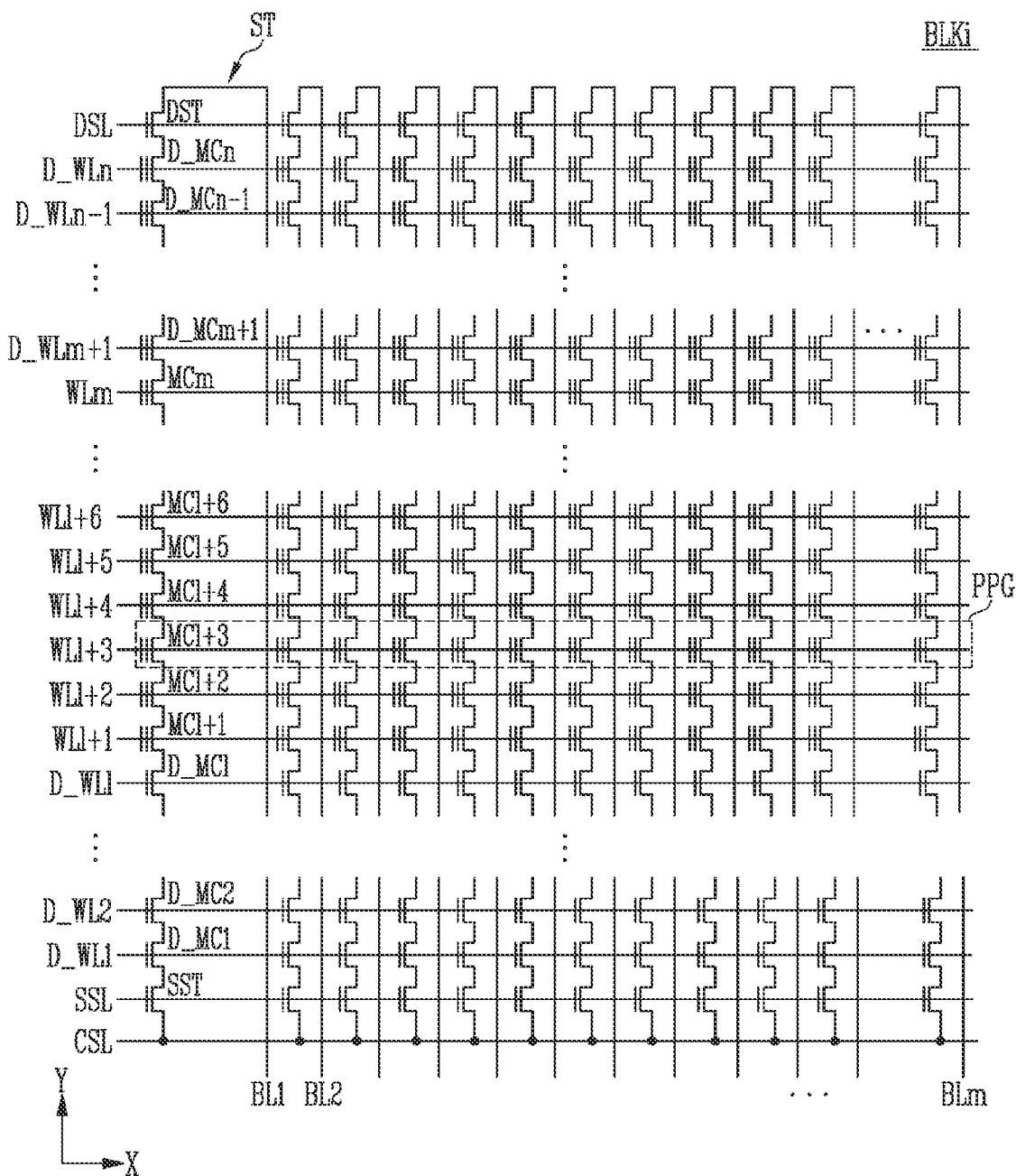
FIG. 3 is a diagram illustrating the structure of any one of a plurality of memory blocks of FIG. 2.

FIG. 3 is a diagram illustrating the structure of any one of the plurality of memory blocks BLK1 to BLKz of FIG. 2.

Referring to FIG. 3, a plurality of word lines arranged in parallel may be coupled between a first select line and a second select line. Here, the first select line may be a source select line SSL, and the second select line may be a drain select line DSL. More specifically, the memory block BLKi may include a plurality of strings ST coupled between bit lines BL1 to BLm and a common source line CSL. The bit lines BL1 to BLm may be coupled to respective strings ST, and the common source line CSL may be coupled in common to the strings ST. The strings ST may be configured in the same manner, and thus the string ST coupled to the first bit line BL1 will be described in detail by way of example.

The string ST may include a source select transistor SST, a plurality of memory cells MCl+1 to MCm and a plurality of dummy memory cells D_MC1 to D_MCl and D_MCm+1 to D_MCn, and a drain select transistor DST, which are coupled in series to each other between the common source line CSL and the first bit line BL1. At least one source select transistor SST and at least one drain select transistor DST may be included in one string ST.

A source of the source select transistor SST may be coupled to the common source line CSL, and a drain of the drain select transistor DST may be coupled to the first bit line BL1. The memory cells MCl+1 to MCm may be coupled in series between the dummy memory cells D_MC1 to D_MCl adjacent to the source select transistor SST and the dummy memory cells D_MCm+1 to D_MCn adjacent to the drain select transistor DST. The dummy memory cells D_MC1 to D_MCl adjacent to the source select transistor SST may be coupled in series between the memory cells MCl+1 to MCm and the source select transistor SST. The dummy memory cells MCm+1 to D_MCn adjacent to the drain select transistor DST may be coupled in series between the memory cells MCl+1 to MCm and the drain select transistor DST. Gates of the source select transistors SST included in different strings ST may be coupled to the source select line SSL, gates of the drain select transistors DST included in different strings ST may be coupled to the drain select line DSL, and gates of the memory cells MCl+1 to MCm may be coupled to a plurality of word lines WL1 to WLm, respectively. The plurality of dummy memory cells D_MC1 to D_MCl and D_MCm+1 to D_MCn may be coupled to a plurality of dummy word lines D_WL1 to D_WLl and D_WLm+1 to D_WLn, respectively. A group of memory cells coupled to the same word line, among the memory cells included in different strings ST, may be referred to as a 'physical page (PPG)'. Therefore, the memory block BLKi may include a number of physical pages (PPG) identical to the number of word lines WL+1 to WLm.

One memory cell may store one bit of data. This cell is typically designated as a "single-level cell (SLC)." In this case, one physical page PPG may store data corresponding to one logical page LPG. The data corresponding to one logical page (LPG) may include a number of data bits identical to the number of cells included in one physical page (PPG).

One memory cell may store two or more bits of data. In this case, one physical page (PPG) may store data corresponding to two or more logical pages (LPG).

Figure 4:
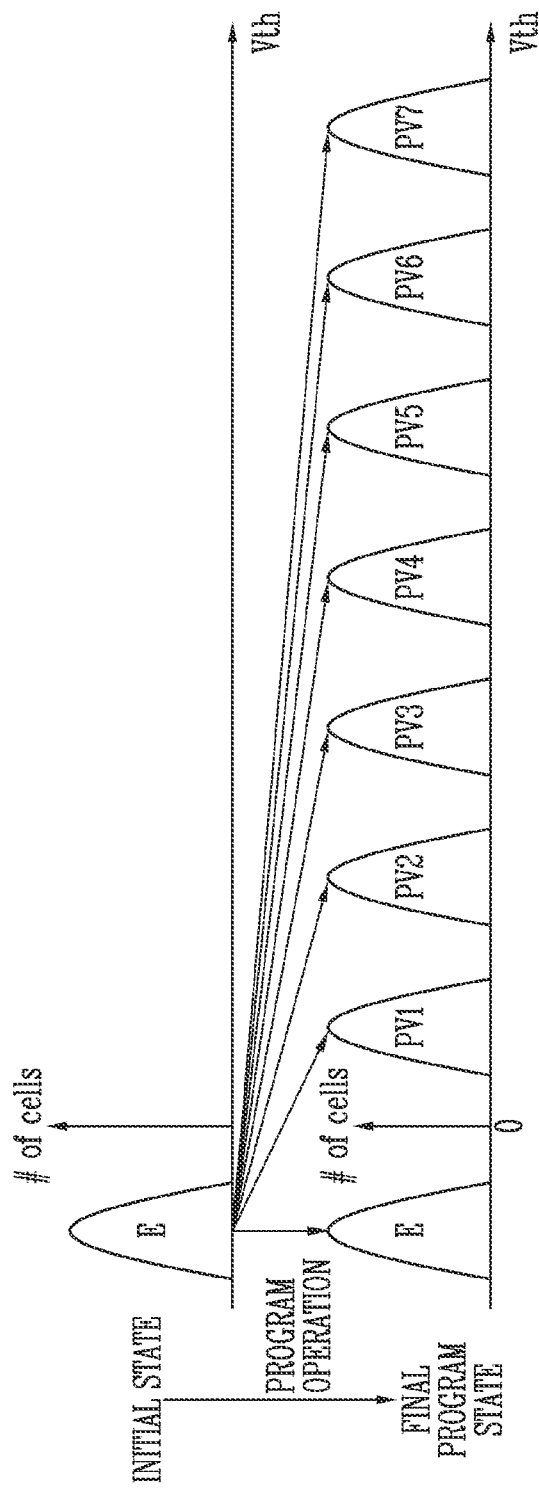
FIG. 4 is a diagram illustrating the threshold voltage distributions of memory cells depending on a program operation of a memory device.

FIG. 4 is a diagram illustrating the threshold voltage distributions of memory cells depending on a program operation of a memory device.

In FIG. 4, the horizontal axis of a graph indicates threshold voltages Vth of memory cells, and the vertical axis of the graph indicates the number of memory cells (# of cells).

Referring to FIG. 4, the threshold voltage distributions of memory cells may be changed from an initial state to a final program state depending on the program operation.

In FIG. 4, a description is made on the assumption that data is programmed using a TLC scheme in which one memory cell stores three bits of data.

The initial state may be a state in which a program operation is not performed and in which the threshold voltage distributions of memory cells are in an erase state E.

The final program state may be the threshold voltage distribution of memory cells on which a program operation is performed. Each of the memory cells on which the program operation is performed may have a threshold voltage corresponding to any one of a plurality of program states. For example, when data is programmed in a triple-level cell (TLC) scheme in which three bits of data are stored in one memory cell, the plurality of program states may indicate the erased state E and first to seventh program states PV1 to PV7. In an embodiment, each of the memory cells on which the program operation is performed may have a threshold voltage corresponding to the erased state E or any one of the first to seventh program states PV1 to PV7. The threshold voltage of each memory cell in the initial state may be increased to the threshold voltage corresponding to the erased state E or any one of the first to seventh program states PV1 to PV7 through the program operation.

Each memory cell may have the erased state E or any one of the program states PV1 to PV7 as a target program state. The target program state may be determined depending on the data to be stored in the corresponding memory cell. The memory cells may have threshold s voltages corresponding to the target program state, among the final program states, through respective program operations.

Figure 5:
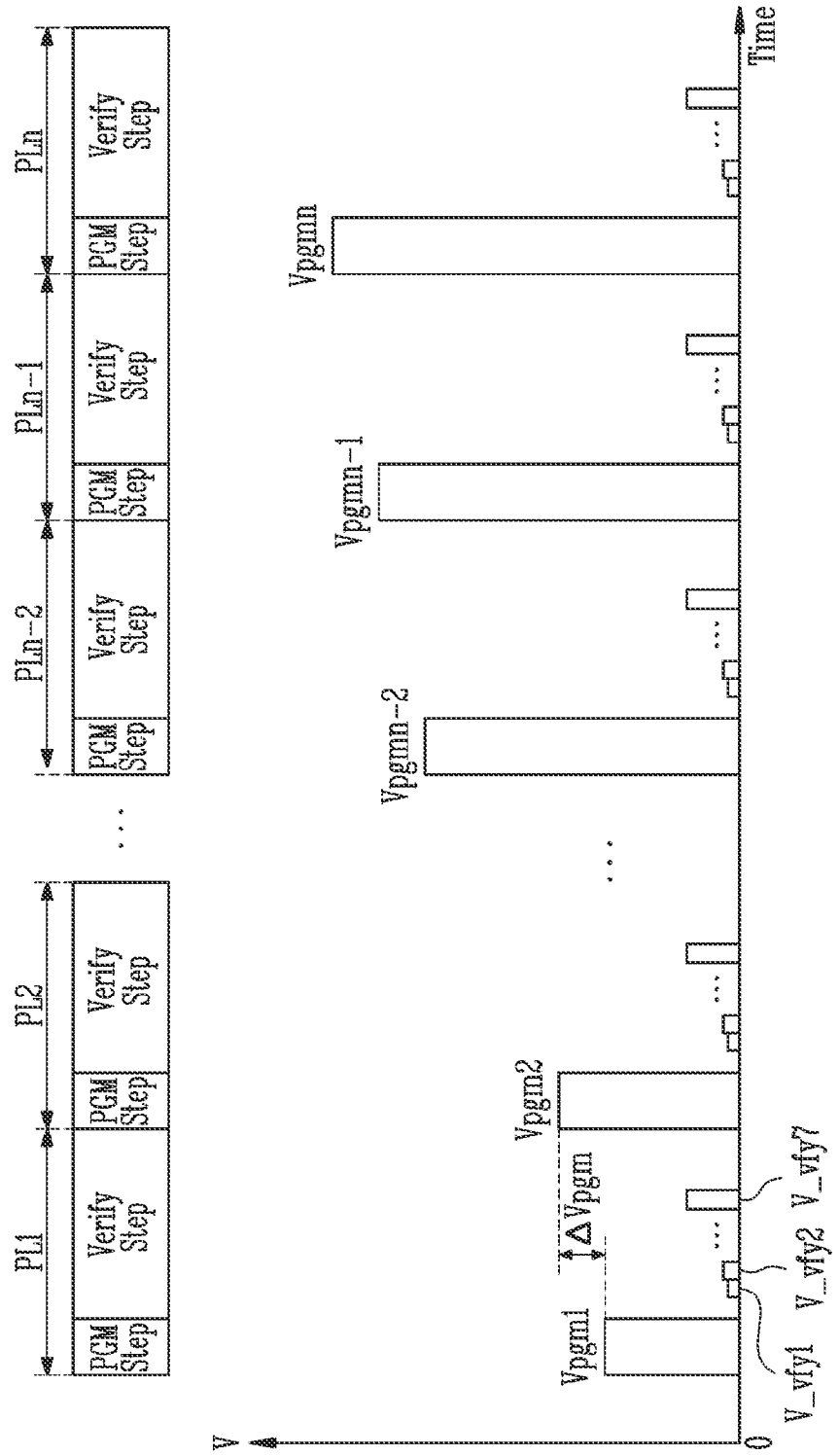
FIG. 5 is a diagram illustrating a program operation of a memory device.

FIG. 5 is a diagram illustrating the program operation of the memory device.

In FIG. 5, the horizontal axis of a graph indicates time and the vertical axis thereof indicates voltage V applied to word lines. The voltage V applied to the word lines may include a program voltage Vpgm and a verify voltage V_vfy.

In FIG. 5, a description is made on the assumption that data is programmed using a TLC scheme in which one memory cell stores three bits of data. However, the scope of the present disclosure is not limited thereto, and a single memory cell may be programmed to store two bits of data or to store four or more bits of data.

Referring to FIG. 5, the program operation of the memory device 100 may include a plurality of program loops PL1 to PLn. The memory device 100 may perform a program operation so that each of selected memory cells coupled to a selected word line has a threshold voltage corresponding to any one of a plurality of program states by performing the plurality of program loops PL1 to PLn. For example, when a single memory cell is programmed in a TLC scheme, the memory device 100 may perform a program operation so that the memory cell has a threshold voltage corresponding to any one of an erased state E and first to seventh program states PV1 to PV7 by performing the plurality of program loops PL1 to PLn.

Each of the plurality of program loops PL1 to PLn may include a program voltage apply operation (PGM Step) and a verify operation (Verify Step).

The program voltage apply operation (PGM Step) may be an operation of applying a program voltage to a selected word line coupled to the selected memory cells. For example, the memory device 100 may apply a first program voltage Vpgm1 to the selected word line coupled to selected memory cells in the first program loop PL1. After the first program voltage Vpgm1 is applied to the selected word line, respective threshold voltages of the selected memory cells may be the threshold voltages corresponding to target program states, among the plurality of program states.

The verify operation (Verify Step) may be an operation of applying a verify voltage to the selected word line coupled to the selected memory cells. The verify operation (Verify step) may be an operation of determining whether respective threshold voltages of the selected memory cells are threshold voltages corresponding to the target program states, among the plurality of program states. The verify operation (Verify Step) may be an operation of applying verify voltages corresponding to respective target program states of the selected memory cells.

In an embodiment, in the first program loop PL1, after the first program voltage Vpgm1 is applied to the selected word line coupled to the selected memory cells, the memory device 100 may apply first to seventh verify voltages V_vfy1 to V_vfy7 to the selected word line. In this case, the verify operation (Verify Step) may be performed on memory cells, having a first program state as the target program state, using the first verify voltage V_vfy1. The verify operation (Verify Step) may be performed on memory cells, having a second program state as the target program state, using the second verify voltage V_vfy2. The verify operation (Verify Step) may be performed on memory cells, having a third program state as the target program state, using the third verify voltage V_vfy3. The verify operation (Verify Step) may be performed on memory cells, having a fourth program state as the target program state, using the fourth verify voltage V_vfy4. The verify operation (Verify Step) may be performed on memory cells, having a fifth program state as the target program state, using the fifth verify voltage V_vfy5. The verify operation (Verify Step) may be performed on memory cells, having a sixth program state as the target program state, using the sixth verify voltage V_vfy6. The verify operation (Verify Step) may be performed on memory cells, having a seventh program state as the target program state, using the seventh verify voltage V_vfy7. The magnitudes of the verify voltages V_vfy1 to V_vfy7 may increase in the direction from the first verify voltage V_vfy1 to the seventh verify voltage V_vfy7. In detail, for the magnitudes of the verify voltages V_vfy1 to V_vfy7, the first verify voltage V_vfy1 may be the lowest, and the seventh verify voltage V_vfy7 is the highest. The number of verify voltages is not limited to the present embodiment.

It may be determined that the memory cells having passed the verify operation (Verify step) using respective verify voltages V_vfy1 to V_vfy7 have threshold voltages corresponding to the target program states. The memory cells having passed the verify operation (Verify Step) may be program-inhibited in the second program loop PL2. A program-inhibit voltage may be applied to bit lines coupled to the program-inhibited memory cells.

It may be determined that the memory cells having failed at the verify step using respective verify voltages V_vfy1 to V_vfy7 do not have threshold voltages corresponding to the target program states. The memory cells having failed at the verify step may perform the second program loop PL2.

In the second program loop PL2, the memory device 100 may apply a second program voltage Vpgm2, higher than the first program voltage Vpgm1 by a unit voltage ΔVpgm, to a selected word line coupled to selected memory cells. Thereafter, the memory device 100 may perform the verify operation (Verify Step) of the second program loop PL2 in the same manner as the verify operation (Verify Step) of the first program loop PL1.

Thereafter, the memory device 100 may perform a subsequent program loop in the same manner as the second program loop PL2 a preset number of times.

In an embodiment, when the program operation is not completed within a preset number of program loops, the program operation may fail. When the program operation is completed within a preset number of program loops, the program operation may pass. Whether the program operation is completed may be determined depending on whether all of the selected memory cells have passed the verify operation (Verify Step). When all of the selected memory cells have passed the verify operation (Verify Step), a subsequent program loop may not be performed.

In an embodiment, the program voltage may be determined based on an incremental step pulse programming (ISPP) method. The level of the program voltage may be increased or decreased by stages (i.e., by a step voltage) as the program loops PL1 to PLn are repeated. The number of applications of program voltages used in each program loop, the voltage levels of the program voltages, voltage apply times, etc. may be determined in various forms under the control of the memory controller 200.

Figure 6:
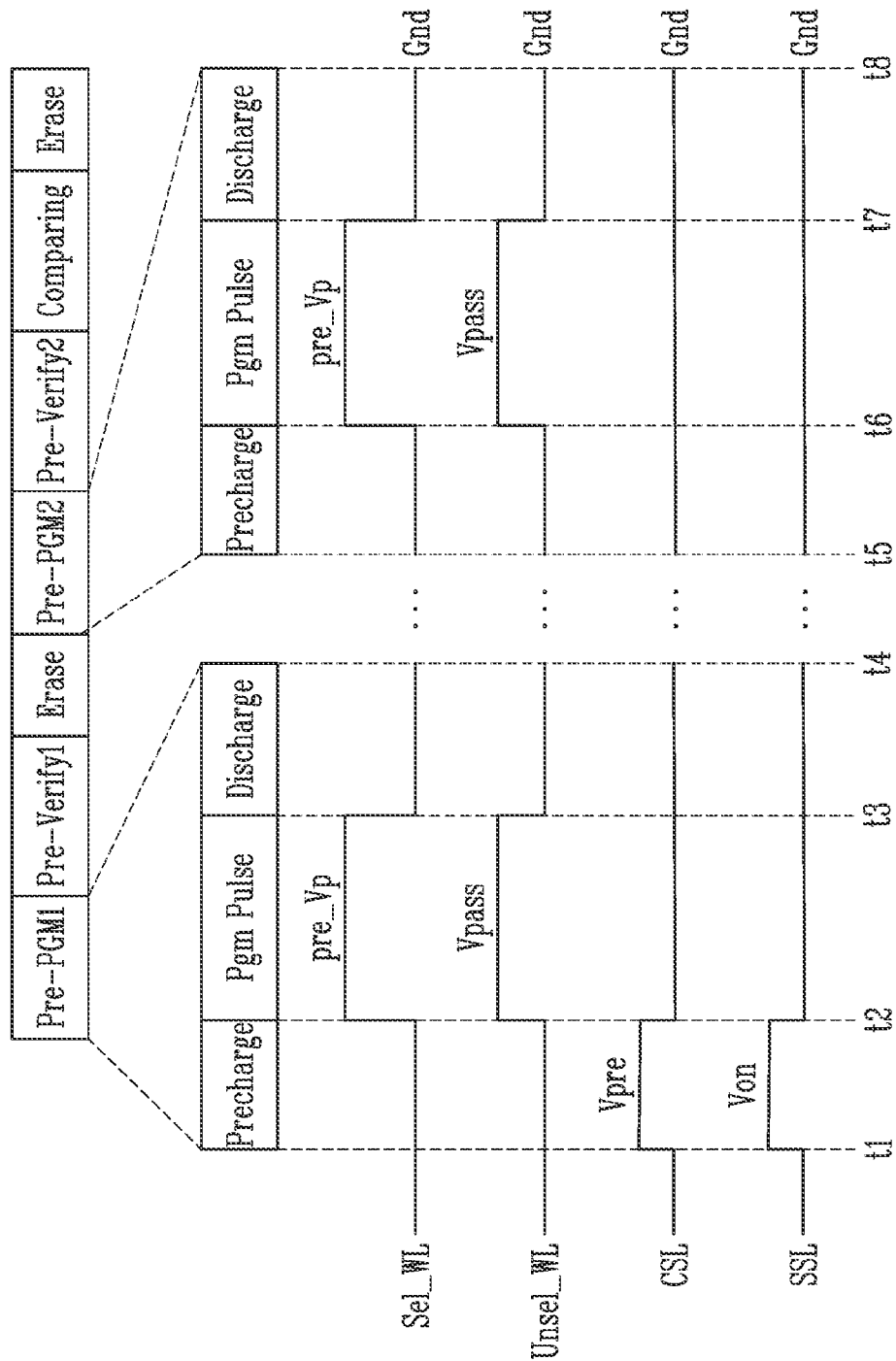
FIG. 6 is a diagram illustrating the operation of a weak word line determiner according to an embodiment of the present disclosure.

FIG. 6 is a diagram illustrating the operation of a weak word line determiner according to an embodiment of the present disclosure.

Referring to FIG. 6, a weak word line determiner 140 may control the peripheral circuit 120 so that a word line test operation is performed on a plurality of memory cells. During the word line test operation, a first pre-program operation (Pre-PGM1 and Pre-Verify1), an erase operation (Erase), a second pre-program operation (Pre-PGD2 and Pre-Verify2), a weak word line determination operation (Comparing), and an erase operation (Erase) may be sequentially performed.

The first pre-program operation (Pre-PGM1 and Pre-Verify1) may include a first pre-program voltage apply operation Pre-PGM1 and a first pre-verify operation Pre-Verify1. The first pre-program voltage apply s operation Pre-PGM1 may include a precharge period Precharge, a program pulse period Pgm Pulse, and a discharge period Discharge.

The second pre-program operation (Pre-PGM2 and Pre-Verify2) may include a second pre-program voltage apply operation Pre-PGM2 and a second pre-verify operation Pre-Verify2. The second pre-program voltage apply operation Pre-PGM2 may include a precharge period Precharge, a program pulse period Pgm Pulse, and a discharge period Discharge.

The first pre-program voltage apply operation Pre-PGM1 and the second pre-program voltage apply operation Pre-PGM2 are described with reference to FIG. 6, and the first pre-verify operation Pre-Verify1 and the second pre-verify operation Pre-Verify2 will be described later with reference to FIG. 7.

A period from t1 to t4 may be a period during which a first pre-program voltage apply operation Pre-PGM1 is performed. A period from t1 to t2 may be a precharge period. The precharge period may be a period during which channel regions of the plurality of memory cells are precharged. During the period from t1 to t2, the weak word line determiner 140 may apply a precharge voltage Vpre to a common source line CSL. During the period from t1 to t2, the weak word line determiner 140 may apply a turn-on voltage Von to a source select line SSL. Here, the turn-on voltage Von may be a voltage higher than the threshold voltage of a source select transistor coupled to the source select line. The weak word line determiner 140 may increase channel potentials of the plurality of memory cells by applying the precharge voltage Vpre to the common source line CSL.

A period from t2 to t3 may be a program pulse period Pgm Pulse. The program pulse period Pgm Pulse may be a period during which the threshold voltages of the plurality of memory cells are increased. During the period from t2 to t3, the weak word line determiner 140 may apply a pre-program voltage pre_Vp to a selected word line Sel_WL. During the period from t2 to t3, the weak word line determiner 140 may apply a pass voltage Vpass to unselected word lines Unsel_WL. During the period from t2 to t3, the weak word line determiner 140 may apply a ground voltage Gnd to the common source line CSL. During the period from t2 to t3, the weak word line determiner 140 may apply the ground voltage Gnd to the source select line SSL.

A period from t3 to t4 may be a discharge period Discharge. During the period from t3 to t4, the weak word line determiner 140 may apply the ground voltage Gnd to the selected word line Sel_WL. During the period from t3 to t4, the weak word line determiner 140 may apply the ground voltage Gnd to the unselected word lines Unsel_WL.

During a period from t4 to t5, the weak word line determiner 140 may perform a first pre-verify operation Pre-Verify1 and an erase operation Erase.

A period from t5 to t8 may be a period during which a second pre-program voltage apply operation Pre-PGH2 is performed. In detail, a period from t5 to t6 may be a precharge period Precharge. During the period from t5 to t6, the weak word line determiner 140 may apply the ground voltage Gnd to the common source line CSL. During the period from t5 to t6, the weak word line determiner 140 may apply the ground voltage Gnd to the source select line SSL.

A period from t6 to t7 may be a program pulse period Pgm Pulse. During the period from t6 to t7, the weak word line determiner 140 may apply the pre-program voltage pre_Vp to the selected word line Sel_WL. During the period from t6 to t7, the weak word line determiner 140 may apply the pass voltage Vpass to the unselected word lines Unsel_WL.

A period from t7 to t8 may be a discharge period Discharge, During the period from t7 to t8, the weak word line determiner 140 may apply the ground voltage Gnd to the selected word line Sel_WL. During the period from t7 to t8, the weak word line determiner 140 may apply the ground voltage Gnd to the unselected word lines Unsel_WL.

After time t8, the weak word line determiner 140 may perform a second pre-verify operation Pre-Verify2, a weak word line determination operation Comparing, and an erase operation Erase.

Figure 7:
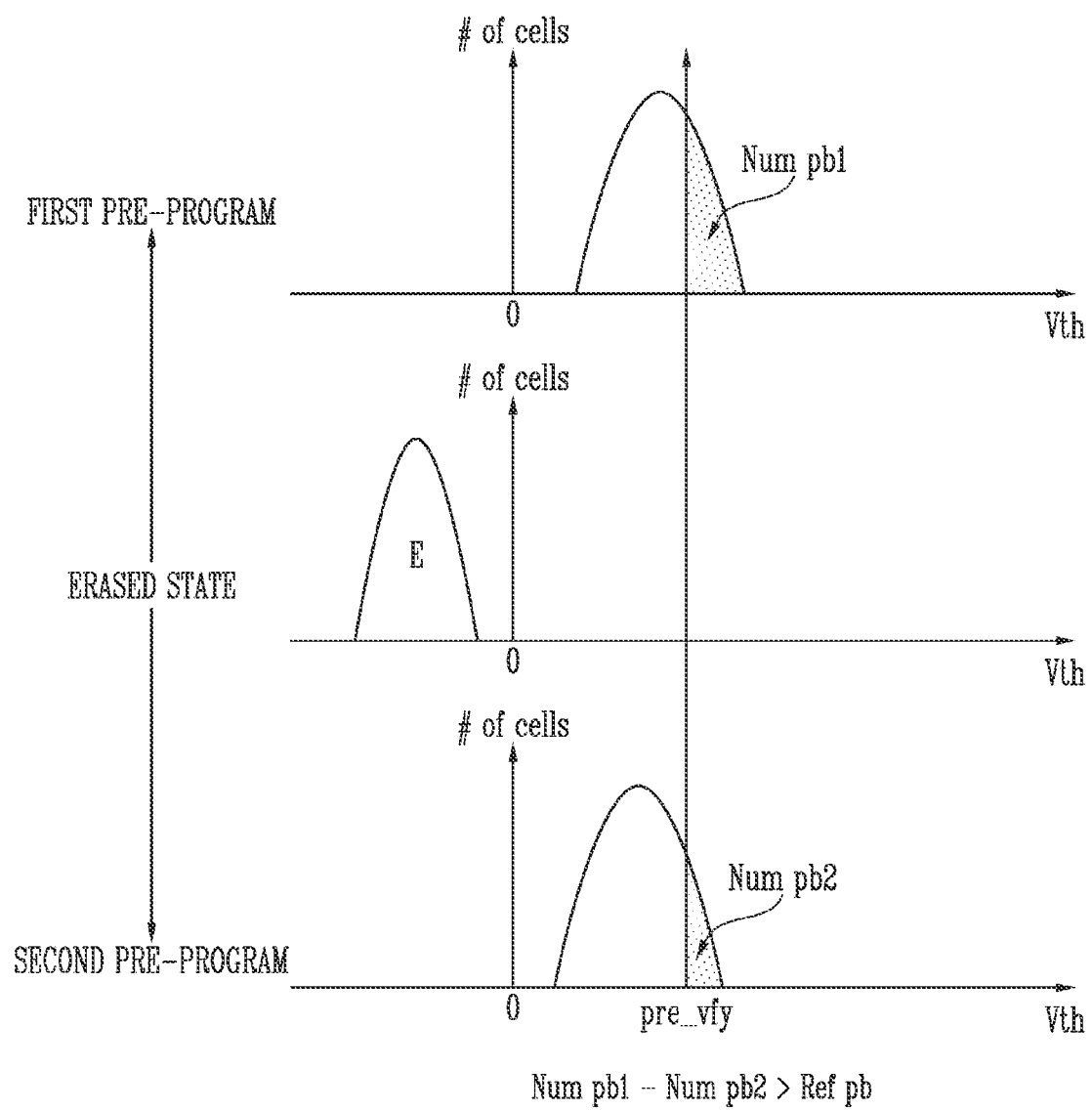
FIG. 7 is a diagram illustrating an operation of determining a weak word line according to an embodiment of the present disclosure.

FIG. 7 is a diagram illustrating an operation of determining a weak word line according to an embodiment of the present disclosure.

In FIG. 7, the horizontal axis of a graph indicates threshold voltages Vth of memory cells, and the vertical axis thereof indicates the number of memory cells (# of cells).

The graph in the upper portion of FIG. 7 may indicate the threshold voltage distribution of memory cells on which a first pre-program voltage apply operation is performed. The graph in the middle portion of FIG. 7 may indicate the threshold voltage distribution of memory cells in an erased state E. The graph in the lower portion of FIG. 7 may indicate the threshold voltage distribution of memory cells on which a second pre-program voltage apply operation is performed. The degree to which the threshold voltages of the memory cells are increased by the first pre-program voltage apply operation may be higher than the degree to which the threshold voltages of the memory cells are increased by the second pre-program voltage apply operation.

Referring to the graph in the upper portion of FIG. 7, the weak word line determiner 140 may perform a first pre-verify operation after performing the first pre-program voltage apply operation. The weak word line determiner 140 may perform the first pre-verify operation of identifying the threshold voltages of the memory cells, which are increased by the first pre-program voltage apply operation. The weak word line determiner 140 may identify the threshold voltages of the memory cells using a pre-verify voltage pre_vfy during the first pre-verify operation. The weak word line determiner 140 may count the number of first off-cells Num pb1 having threshold voltages higher than the pre-verify voltage pre_vfy during the first pre-verify operation. In an embodiment, the weak word line determiner 140 may store the number of first off-cells Num pb1 identified through the first pre-verify operation in a page buffer. In an embodiment, the weak word line determiner 140 may perform an erase operation after performing the first pre-program operation.

Referring to the graph in the lower portion of FIG. 7, the weak word line determiner 140 may perform a second pre-verify operation after performing the second pre-program voltage apply operation. The weak word line determiner 140 may perform the second pre-verify operation of identifying the threshold voltages of the memory cells, which are increased by the second pre-program voltage apply operation. The weak word line determiner 140 may identify the threshold voltages of the memory cells using the pre-verify voltage pre_vfy during the second pre-verify operation. The weak word line determiner 140 may count the number of second off-cells Num pb2 having threshold voltages higher than the pre-verify voltage pre_vfy during the second pre-verify operation. In an embodiment, the weak word line determiner 140 may store the number of second off-cells Num pb2 identified through the second pre-verify operation in the page buffer.

Thereafter, the weak word line determiner 140 may perform a weak word line determination operation of determining, based on the number of first off-cells Num pb1 and the number of second off-cells Num pb2, whether the word line coupled to the memory cells is a weak word line. In detail, the weak word line determiner 140 may determine a word line coupled to memory cells, for which the difference between the number of first off-cells Num pb1 and the number of second off-cells Num pb2 is greater than the reference number of off-cells Ref pb, to be a weak word line. On the other hand, the weak word line determiner 140 may determine a word line coupled to memory cells, for which the difference between the number of first off-cells Num pb1 and the number of second off-cells Num pb2 is less than or equal to the reference number of off-cells Ref pb, to be a normal word line. In an embodiment, the weak word line determiner 140 may perform an erase operation after performing the weak word line determination operation.

The weak word line determiner 140 may determine whether each of the plurality of word lines is a weak word line by performing the first pre-program operation and the second pre-program operation. In an embodiment, the weak word line determiner 140 may store weak word line information, obtained by determining whether the plurality of word lines are weak word lines, in any one of the plurality of memory blocks BLK1 to BLKz illustrated in FIG. 2. The one memory block may be a content addressable memory block (CAM Block). For example, the CAM block may store program voltage information required for performing the program operation of the memory device 100, the address of a bad memory block, etc. In an embodiment, the weak word line determiner 140 may include a weak word line information storage 141 of FIG. 2 which stores the weak word line information read from the one memory block. The weak word line determiner 140 may provide the weak word line information to the program operation controller 150.

Figure 8:
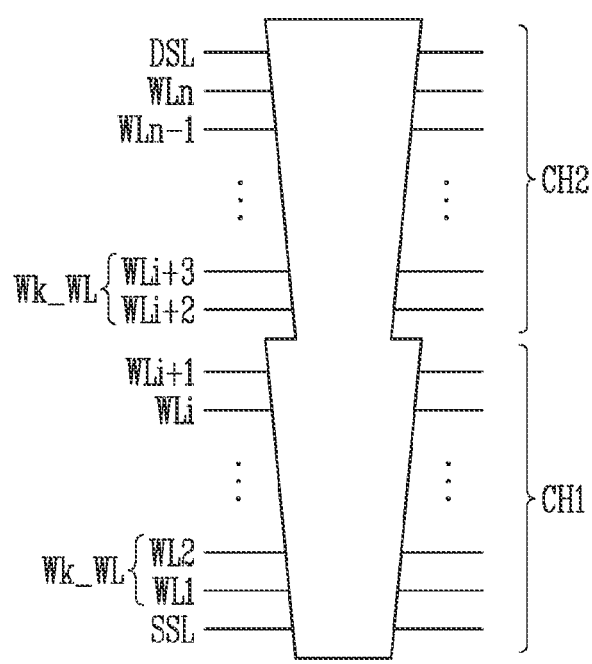
FIG. 8 is a diagram illustrating information about a weak word line.

FIG. 8 is a diagram illustrating information about weak word lines.

Referring to FIG. 8, a memory cell array may be a structure in which a plurality of memory cells are stacked along a first channel region CH1 and a second channel region CH2. The first channel region CH1 may include first memory cells. The second channel region CH2 may include second memory cells. Each of a plurality of word lines WL1 to WLn may be coupled to memory cells. Word lines disposed in the lower portion of the first channel region CH1 and word lines disposed in the lower portion of the second channel region CH2 may be weak word lines Wk_WL. For example, first and second word lines WL1 and WL2, i+2-th and i+3-th word lines WLi+2 and WLi+3 may be weak word lines Wk_WL. Word lines coupled to memory cells disposed in the lower portions of the first channel region CH1 and the second channel region CH2 may be weak word lines Wk_WL. The weak word line determiner 140 may store information about the word lines disposed in respective lower portions of the first channel region CH1 and the second channel region CH2 as information about each weak word line (i.e., weak word line information). In an embodiment, although not illustrated in FIG. 8, dummy word lines may be included between a drain select line DSL and the n-th word line WLn. In an embodiment, dummy word lines may be included between a source select line SSL and the first word line WU. In an embodiment, dummy word lines may be included between the i+1-th word line WLi+1 and the i+2-th word line WLi+2.

Figure 9:
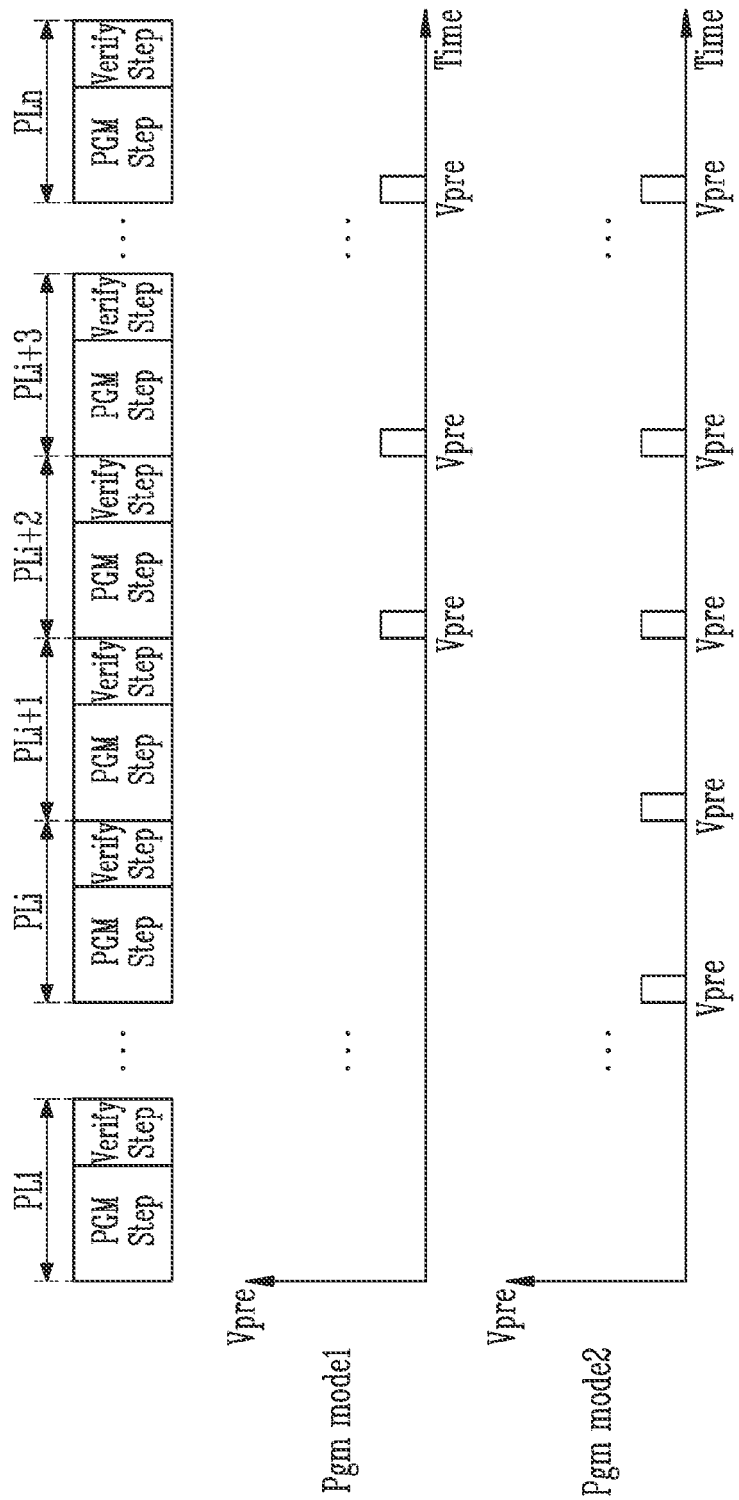
FIG. 9 is a diagram illustrating a first embodiment of a program operation performed in a first program mode or a second program mode.

FIG. 9 is a diagram illustrating a first embodiment of a program operation performed in a first program mode or a second program mode.

In FIG. 9, the horizontal axis of a graph indicates time and the vertical axis thereof indicates a precharge voltage Vpre applied to a common source line.

A program operation controller 150 may receive a program command, an address, and data from a memory controller, and may then perform a program operation. The program operation controller 150 may perform the program operation on selected memory cells coupled to a selected word line corresponding to the address received from the memory controller.

The program operation controller 150 may determine the mode of the program operation to be a first program mode Pgm mode1 or a second program mode Pgm mode2 based on the weak word line information received from the weak word line determiner 140. In an embodiment, when the selected word line is determined to be a weak word line based on the weak word line information, the program operation controller 150 may perform the program operation in the first program mode. In an embodiment, when the selected word line is determined to be a normal word line based on the weak word line information, the program operation controller 150 may perform the program operation in the second program mode.

Referring to FIG. 9, the program operation may include a plurality of program loops PL1 to PLn. In a program voltage apply operation (PGM step), the program operation controller 150 may apply a precharge voltage Vpre to a common source line and thereafter apply a program voltage to the selected word line.

In the first program mode Pgm mode1, the program operation controller 150 may apply the precharge voltage Vpre to the common source line from any one of the plurality of program loops PL1 to PLn. The one program loop may be a preset program loop. For example, in the first program mode Pgm mode1, the program operation controller 150 may apply the precharge voltage Vpre to the common source line from an i+2-th program loop PLi+2, among the plurality of program loops PL1 to PLn.

In the second program mode Pgm mode2, the program operation controller 150 may apply the precharge voltage Vpre to the common source line from a program loop previous to the one program loop. For example, in the second program mode Pgm mode2, the program operation controller 150 may apply the precharge voltage Vpre to the common source line from an i-th program loop PLi, among the plurality of program loops PL1 to PLn. That is, the number of program loops in which the precharge voltage Vpre is applied to the common source line in the first program mode Pgm mode1 may be less than the number of program loops in which the precharge voltage Vpre is applied to the common source line in the second program mode Pgm mode2. The number of program loops in which the precharge voltage Vpre is applied to the common source line in a program operation on memory cells coupled to a weak word line may be less than the number of program loops in which the precharge voltage Vpre is applied to the common source line in a program operation on the memory cells coupled to a normal word line.

Figure 10:
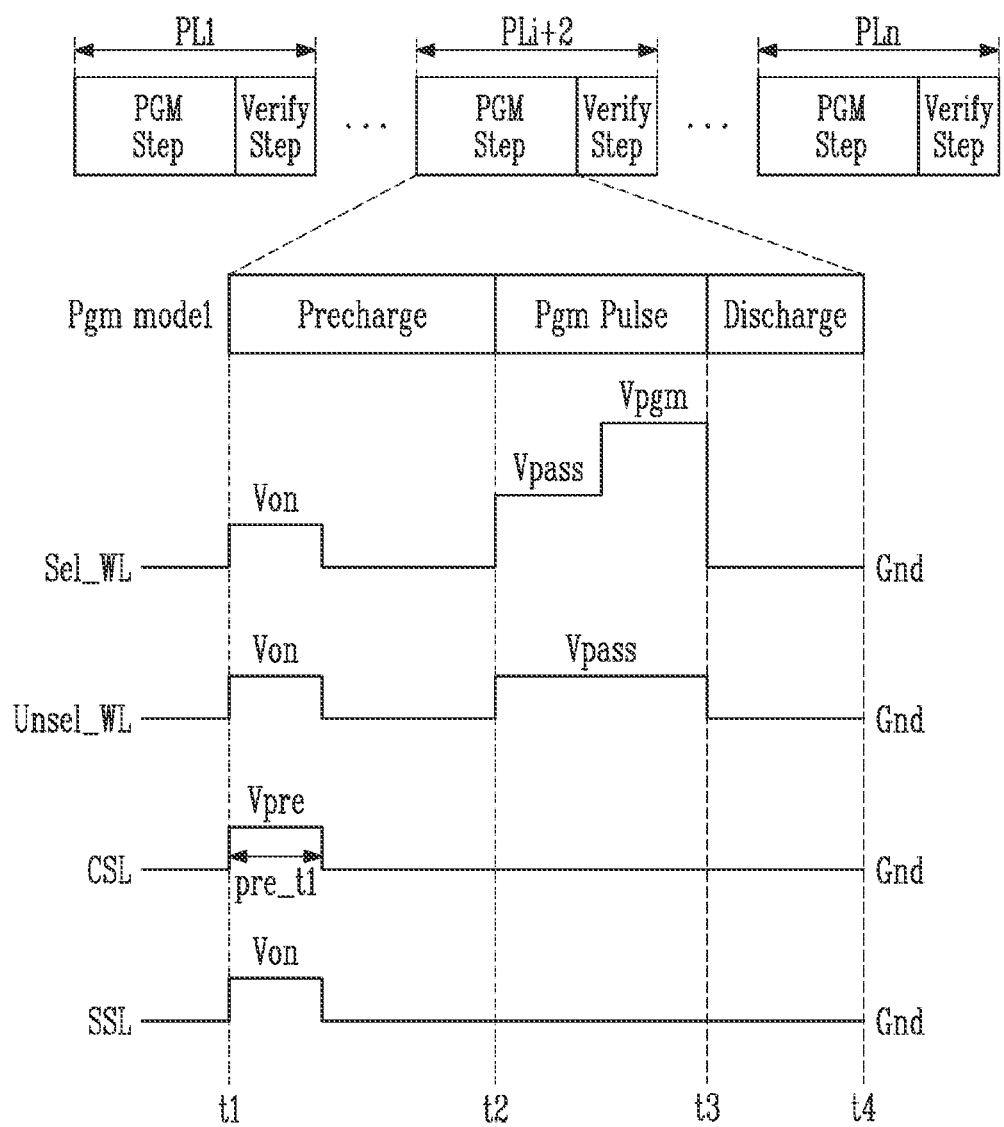
FIG. 10 is a diagram illustrating a second embodiment of a program operation performed in a first program mode.

FIG. 10 is a diagram illustrating a second embodiment of a program operation performed in a first program mode.

Figure 11:
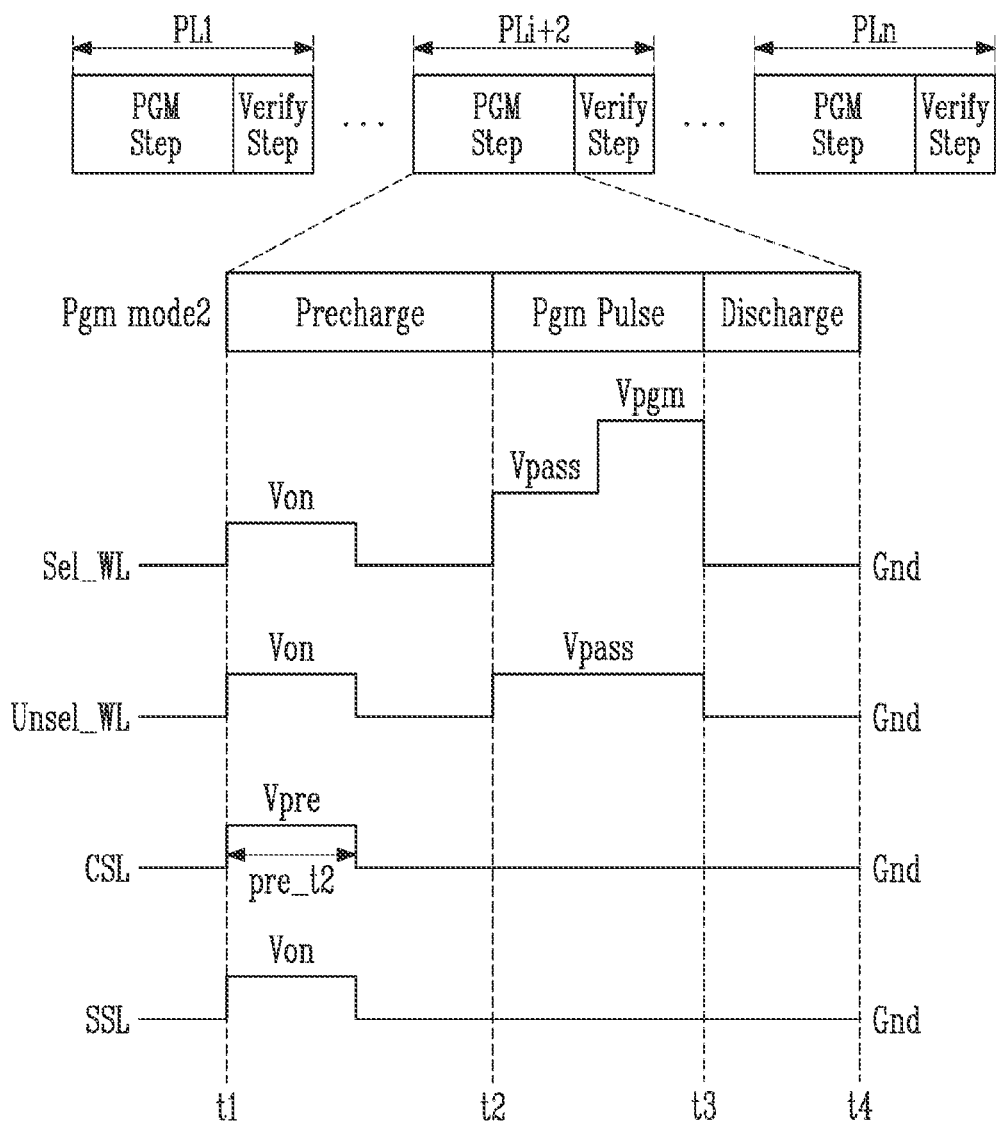
FIG. 11 is a diagram illustrating a second embodiment of a program operation performed in a second program mode.

FIG. 11 is a diagram illustrating a second embodiment of a program operation performed in a second program mode.

Referring to FIGS. 10 and 11, each of a plurality of program loops PL1 to PLn may include a program voltage apply operation (PGM Step) and a verify operation (Verify Step). The program voltage apply operation (PGM Step) may include a precharge period Precharge, a program pulse period Pgm Pulse, and a discharge period Discharge.

Referring to FIG. 10, a program operation controller 150 may perform a program operation in a first program mode Pgm mode1. A period from t1 to t2 may be a precharge period. During the period from t1 to t2, the program operation controller 150 may apply a turn-on voltage Von to a selected word line Sel_WL for a first time pre_t1 and thereafter apply a ground voltage Gnd thereto. During the period from t1 to t2, the program operation controller 150 may apply the turn-on voltage Von to unselected word lines Unsel_WL for the first time pre_t1 and thereafter apply the ground voltage Gnd thereto. During the period from t1 to t2, the program operation controller 150 may apply a precharge voltage Vpre to a common source line CSL for the first time pre_t1 and thereafter apply the ground voltage Gnd thereto. During the period from t1 to t2, the program operation controller 150 may apply the turn-on voltage Von to a source select line SSL for the first time pre_t1 and thereafter apply the ground voltage Gnd thereto.

Referring to FIG. 11, the program operation controller 150 may perform a program operation in a second program mode Pgm mode2. During the period from t1 to t2, the program operation controller 150 may apply a turn-on voltage Von to a selected word line Sel_WL for a second time pre_t2 and thereafter apply a ground voltage Gnd thereto. During the period from t1 to t2, the program operation controller 150 may apply the turn-on voltage Von to unselected word lines Unsel_WL for the second time pre_t2 and thereafter apply the ground voltage Gnd thereto. During the period from t1 to t2, the program operation controller 150 may apply a precharge voltage Vpre to a common source line CSL for the second time pre_t2 and thereafter apply the ground voltage Gnd thereto. During the period from t1 to t2, the program operation controller 150 may apply the turn-on voltage Von to a source select line SSL for the second time pre_t2 and thereafter apply the ground voltage Gnd thereto.

The first time pre_t1 may be shorter than the second time pre_t2. The time during which the precharge voltage Vpre is applied to the common source line CSL in the first program mode Pgm mode1 may be shorter than the time during which the precharge voltage Vpre is applied to the common source line CSL in the second program mode Pgm mode2. That is, the time during which channel regions of the memory cells are precharged in the first program mode Pgm mode1 may be shorter than the time during which the channel regions of the memory cells are precharged in the second program mode Pgm mode2. The time during which the precharge voltage Vpre is applied to the common source line CSL in the program operation performed on memory cells coupled to a weak word line may be shorter than the time during which the precharge voltage Vpre is applied to the common source line CSL in the program operation performed on memory cells coupled to a normal word line.

Referring to FIGS. 10 and 11, a period from t2 to t3 may be a program pulse period Pgm Pulse. During the period from t2 to t3, the program operation controller 150 may apply a pass voltage Vpass to a selected word line Sel_WL and thereafter apply a program voltage Vpgm thereto. During the period from t2 to t3, the program operation controller 150 may apply the pass voltage Vpass to unselected word lines Unsel_WL.

Referring to FIGS. 10 and 11, a period from t3 to t4 may be a discharge period Discharge. During the period from t3 to t4, the program operation controller 150 may apply the ground voltage Gnd to the selected word line Sel_WL. During the period from t3 to t4, the program operation controller 150 may apply the ground voltage Gnd to the unselected word lines Unsel_WL.

Figure 12:
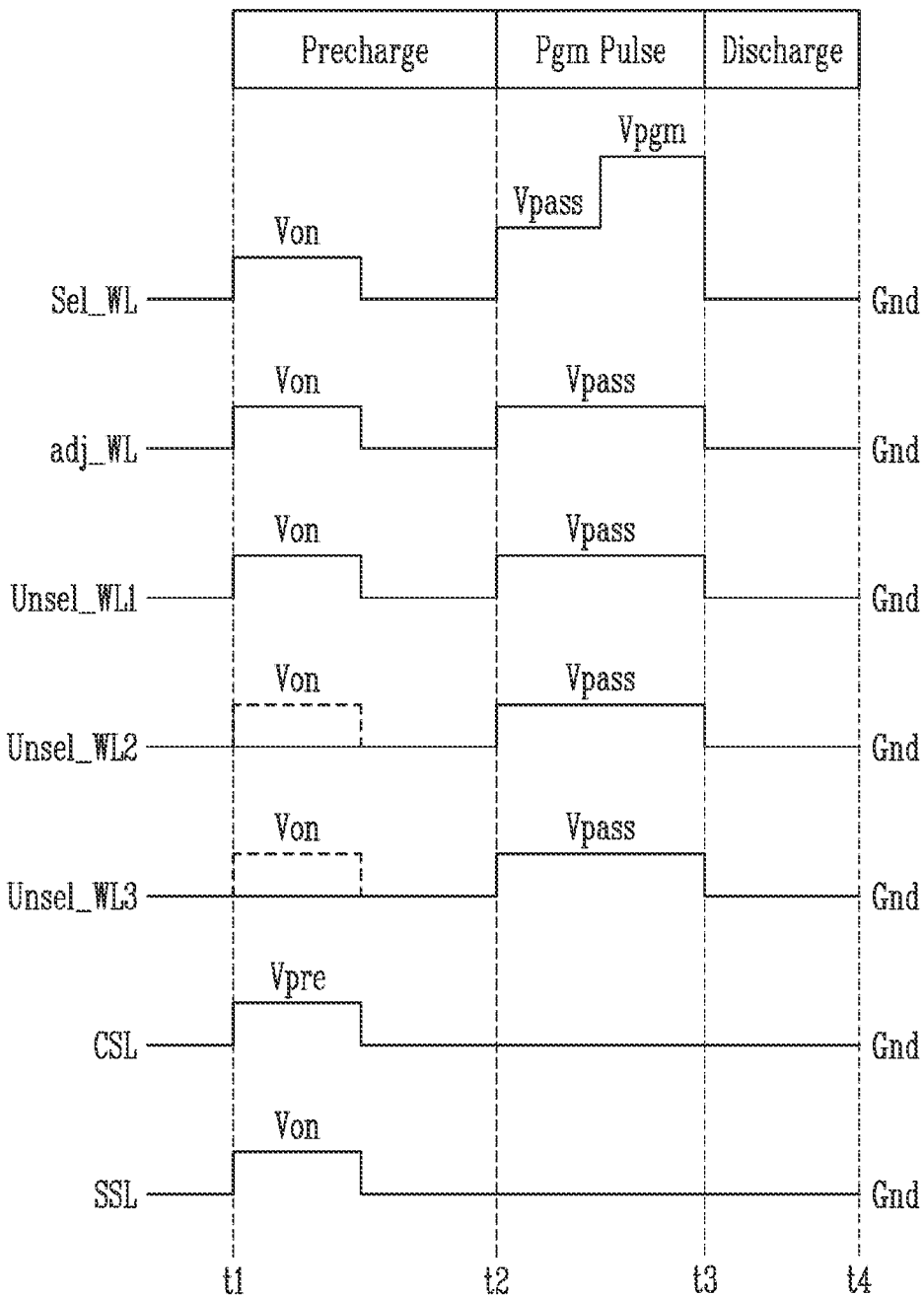
FIG. 12 is a diagram illustrating a third embodiment of a program operation performed in a first program mode.

FIG. 12 is a diagram illustrating a third embodiment of a program operation performed in a first program mode.

Figure 13:
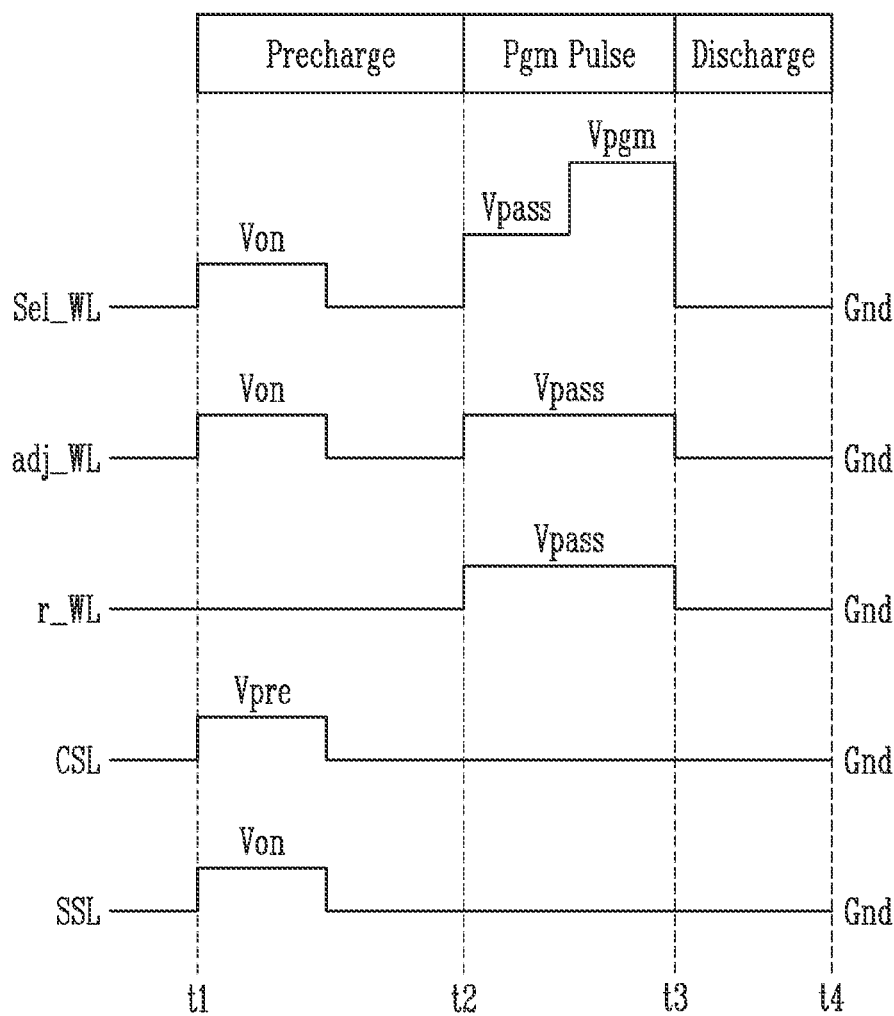
FIG. 13 is a diagram illustrating a third embodiment of a program operation performed in a second program mode.

FIG. 13 is a diagram illustrating a third embodiment of a program operation performed in a second program mode.

In FIGS. 12 and 13, repeated descriptions of components identical to those in FIGS. 10 and 11 will be omitted.

Referring to FIGS. 12 and 13, the program voltage apply operation (PGM Step) may include a precharge period Precharge, a program puke period Pgm Puke, and a discharge period Discharge.

Referring to FIG. 12, a program operation controller 150 may perform a program operation in a first program mode Pgm mode1. A period from t1 to t2 may be a precharge period. During the period from t1 to t2, the program operation controller 150 may apply a turn-on voltage Von to a selected word line Sel_WL and thereafter apply a ground voltage Gnd thereto. During the period from t1 to t2, the program operation controller 150 may apply the turn-on voltage Von to word lines adj_WL adjacent to the selected word line and thereafter apply the ground voltage Gnd thereto. During the period from t1 to t2, the program operation controller 150 may apply the turn-on voltage Von to a first unselected word line group Unsel_WL1 and thereafter apply the ground voltage Gnd thereto. In an embodiment, during the period from t1 to t2, the program operation controller 150 may apply the turn-on voltage Von to the first and second unselected word line groups Unsel_WL1 and Unsel_WL2 and thereafter apply the ground voltage Gnd thereto. In an embodiment, during the period from t1 to t2, the program operation controller 150 may apply the ground voltage Gnd to the first and second unselected word line groups Unsel_WL1 and Unsel_WL2. The first unselected word line group Unsel_WL1 may be word lines adjacent to a source select line SSL. A third unselected word line group Unsel_WL3 may be word lines adjacent to a drain select line. During the period from t1 to t2, the program operation controller 150 may apply a precharge voltage Vpre to a common source line CSL and thereafter apply the ground voltage Gnd thereto. During the period from t1 to t2, the program operation controller 150 may apply the turn-on voltage Von to the source select line SSL and thereafter apply the ground voltage Gnd thereto.

Referring to FIG. 13, the program operation controller 150 may perform a program operation in a second program mode Pgm mode2. During the period from t1 to t2, the program operation controller 150 may apply a turn-on voltage Von to a selected word line Sel_WL and thereafter apply a ground voltage Gnd thereto. During the period from t1 to t2, the program operation controller 150 may apply the turn-on voltage Von to word lines adj_WL adjacent to the selected word line and thereafter apply the ground voltage Gnd thereto. During the period from t1 to t2, the program operation controller 150 may apply the ground voltage Gnd to the remaining word lines r_WL, other than the selected word line and the adjacent word lines, among the plurality of word lines. During the period from t1 to t2, the program operation controller 150 may apply the precharge voltage Vpre to a common source line CSL and thereafter apply the ground voltage Gnd thereto. During the period from t1 to t2, the program operation controller 150 may apply the turn-on voltage Von to the source select line SSL and thereafter apply the ground voltage Gnd thereto.

In the first program mode Pgm mode1, the turn-on voltage Von may be applied to the remaining word lines r_WL, other than the word lines adjacent to the selected word line during a precharge period. In the second program mode Pgm mode2, the ground voltage Gnd may be applied to the remaining word lines r_WL, other than the word lines adjacent to the selected word line, during the precharge period. While the precharge voltage Vpre is applied to the common source line CSL in a program operation on the memory cells coupled to a weak word line, the turn-on voltage Von may be applied to the remaining word lines. While the precharge voltage Vpre is applied to the common source line CSL in a program operation on the memory cells coupled to a normal word line, the ground voltage Gnd may be applied to the remaining word lines.

Figure 14:
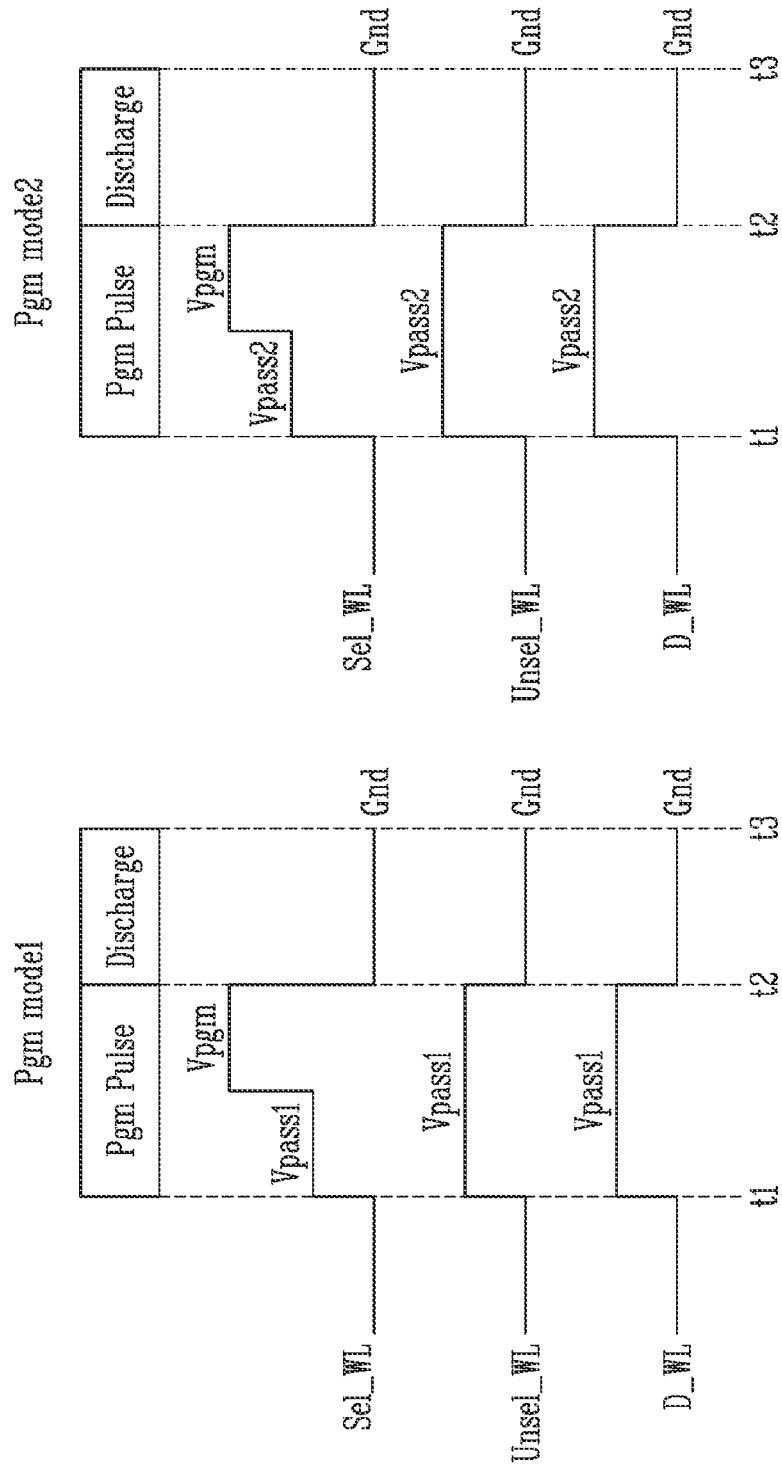
FIG. 14 is a diagram illustrating a fourth embodiment of a program operation performed in a first program mode or a second program mode.

FIG. 14 is a diagram illustrating a fourth embodiment of a program operation performed in a first program mode or a second program mode.

In FIG. 14, only a program pulse period Pgm Pulse included in the program voltage apply operation (PGM Step), which is the difference between the first program mode and the second program mode, will be described in detail.

Referring to FIG. 14, in the first program mode Pgm mode1, the program operation controller 150 may apply a first pass voltage Vpass1 to a selected word line Sel_WL and thereafter apply a program voltage Vpgm thereto. In the first program mode Pgm mode1, the program operation controller 150 may apply the first pass voltage Vpass1 to unselected word lines Unsel_WL. In the first program mode Pgm mode1, the program operation controller 150 may apply the first pass voltage Vpass1 to dummy word lines D_WL. In an embodiment, in the first program mode Pgm mode1, the program operation controller 150 may apply a second pass voltage Vpass2 higher than the first pass voltage Vpass1 to word lines, adjacent to the selected word line, among the unselected word lines, and the dummy word lines D_WL, and may apply the first pass voltage Vpass1 to the remaining word lines, other than the adjacent word lines, among the unselected word lines. For example, the dummy word lines D_WL may be dummy word lines D_WL1 to D_WLl and D_WLm+1 to D_WLn, illustrated in FIG. 3. In an example, the dummy word lines D_WL may be word lines disposed between the i+1-th word line WLi+1 and the i+2-th word line WLi+2, illustrated in FIG. 8.

In the second program mode Pgm mode2, the program operation controller 150 may apply a second pass voltage Vpass2 to the selected word line Sel_WL, and thereafter apply the program voltage Vpgm thereto. In the second program mode Pgm mode2, the program operation controller 150 may apply the second pass voltage Vpass2 to the unselected word lines Unsel_WL. In the second program mode Pgm mode2, the program operation controller 150 may apply the second pass voltage Vpass2 to the dummy word lines D_WL.

The magnitude of the second pass voltage Vpass2 may be greater than that of the first pass voltage Vpass1. In the first program mode Pgm mode1, the program operation controller 150 may apply the first pass voltage Vpass1 to the unselected word lines Unsel_WIL and the dummy word lines D_WL while applying the program voltage Vpgm to the selected word line Sel_WL. In the second program mode Pgm mode2, the program operation controller 150 may apply the second pass voltage Vpass2, higher than the first pass voltage Vpass1, to the unselected word lines Unsel_WL and the dummy word lines D_WL while applying the program voltage Vpgm to the selected word line Sel_WL.

Figure 15:
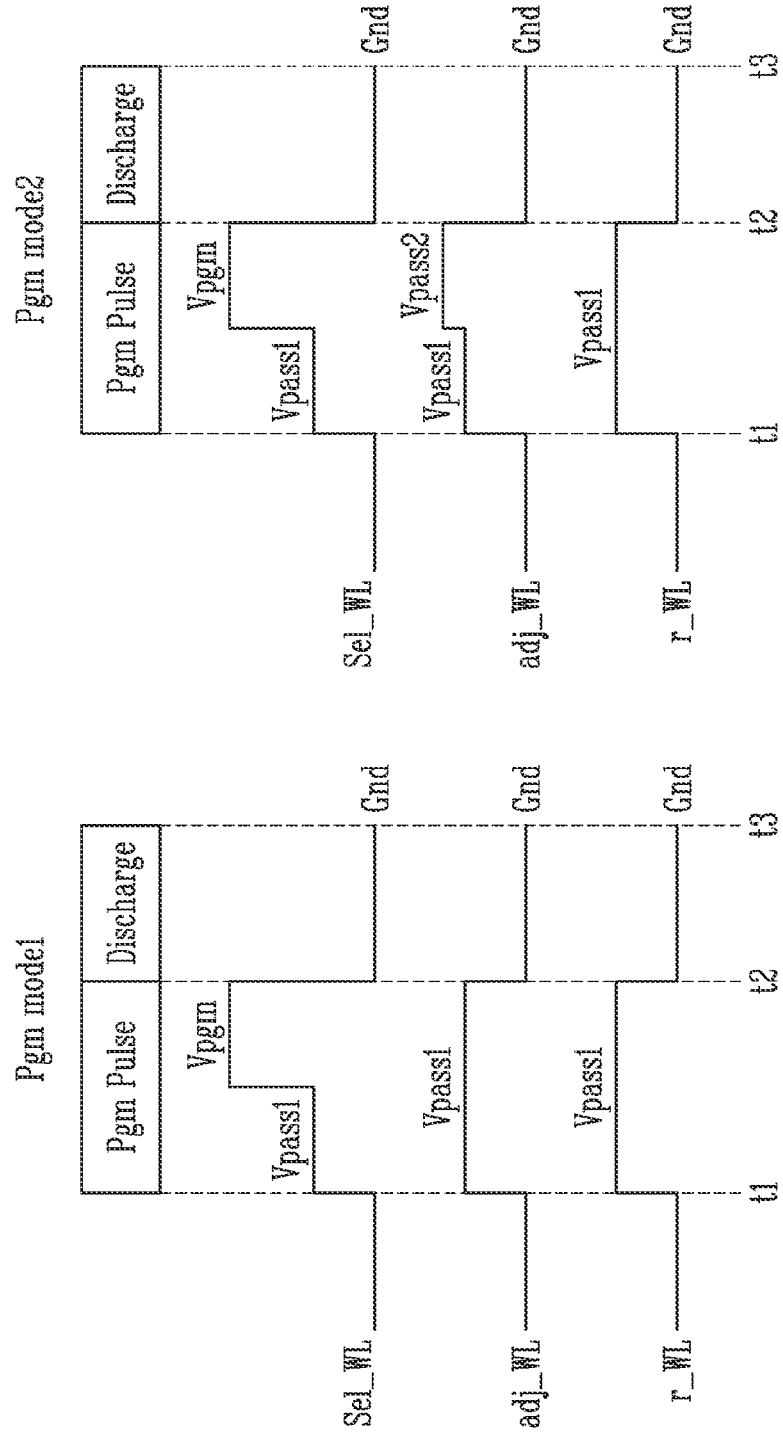
FIG. 15 is a diagram illustrating a fifth embodiment of a program operation performed in a first program mode or a second program mode.

FIG. 15 is a diagram illustrating a fifth embodiment of a program operation performed in a first program mode or a second program mode.

In FIG. 15, only a program pulse period Pgm Pulse included in the program voltage apply operation (PGM Step), which is the difference between the first program mode and the second program mode, will be described in detail.

Referring to FIG. 15, in the first program mode Pgm mode1, the program operation controller 150 may apply a first pass voltage Vpass1 to a selected word line Sel_WL and thereafter apply a program voltage Vpgm thereto. In the first program mode Pgm mode1, the program operation controller 150 may apply the first pass voltage Vpass1 to word lines adj_WL adjacent to a selected word line. In the first program mode Pgm mode1, the program operation controller 150 may apply the first pass voltage Vpass1 to the remaining word lines r_WL, other than word lines adjacent to the selected word line, among unselected word lines.

In the second program mode Pgm mode2, the program operation controller 150 may apply the first pass voltage Vpass1 to the selected word line Sel_WL and thereafter apply the program voltage Vpgm thereto. In the second program mode Pgm mode2, the program operation controller 150 may apply the first pass voltage Vpass1 to word lines adj_WL adjacent to the selected word line and thereafter apply a second pass voltage Vpass2, higher than the first pass voltage Vpass1, thereto. In the second program mode Pgm mode2, the program operation controller 150 may apply the first pass voltage Vpass1 to the remaining word lines r_WL.

In the first program mode Pgm mode1, the program operation controller 150 may apply the first pass voltage Vpass1 to the word lines adj_WL adjacent to the selected word line while applying the program voltage Vpgm to the selected word line Sel_WL. In the second program mode Pgm mode2, the program operation controller 150 may apply the second pass voltage Vpass2, higher than the first pass voltage Vpass1, to the word lines adj_WL adjacent to the selected word line while applying the program voltage Vpgm to the selected word line Sel_WL.

Figure 16:
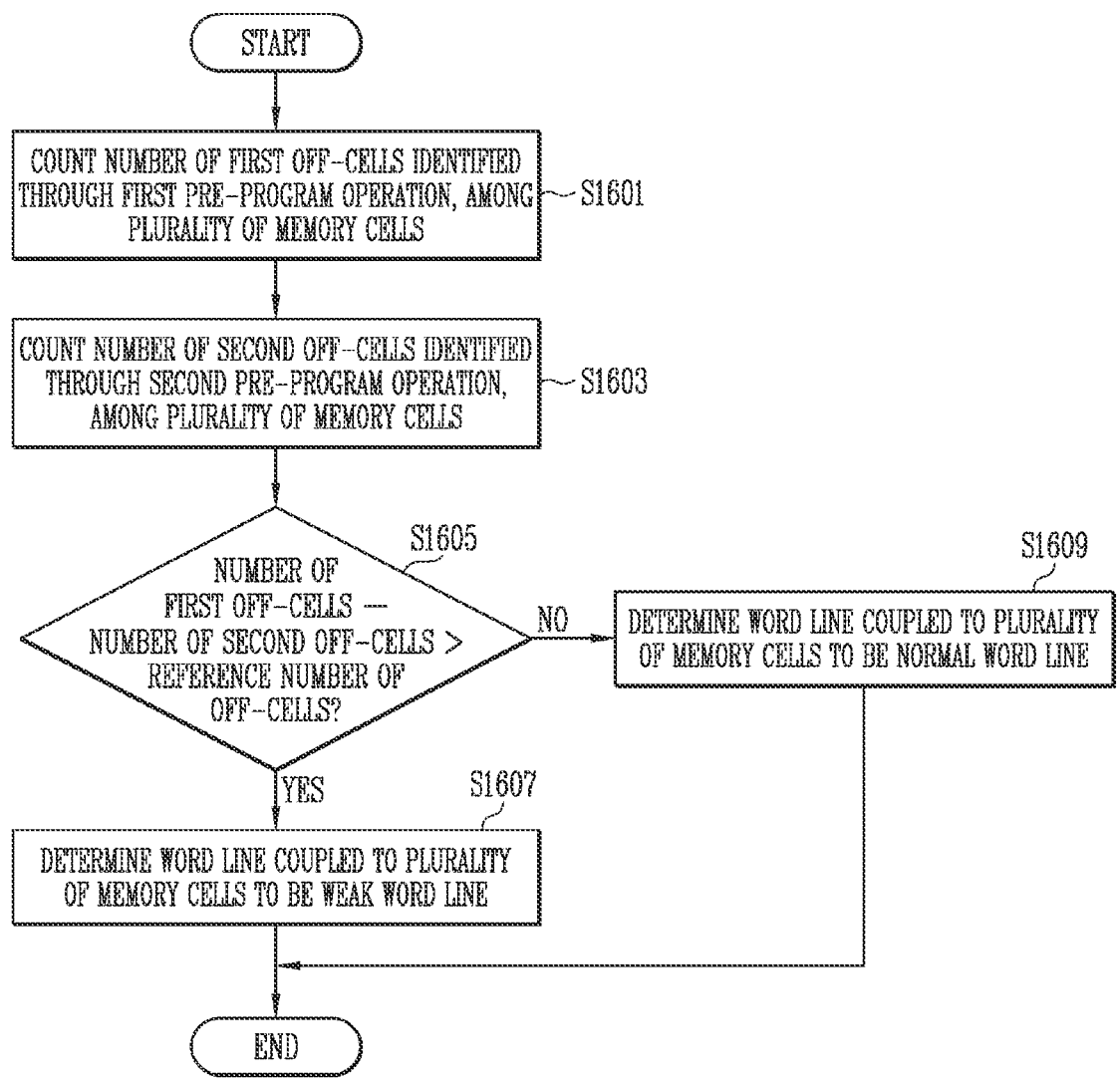
FIG. 16 is a flowchart illustrating a word line test operation of determining a weak word line according to an embodiment of the present disclosure.

FIG. 16 is a flowchart illustrating a word line test operation of determining a weak word line according to an embodiment of the present disclosure.

Referring to FIG. 16, at step S1601, a memory device 100 may count the number of first off-cells identified through a first pre-program operation, among a plurality of memory cells. The memory device 100 may store the number of first off-cells in a page buffer. In an embodiment, the memory device 100 may perform an erase operation on the plurality of memory cells after performing step S1601.

At step S1603, the memory device 100 may count the number of second off-cells identified through a second pre-program operation, among the plurality of memory cells. The memory device 100 may store the number of second off-cells in the page buffer. In an embodiment, the memory device 100 may perform an erase operation on the plurality of memory cells after performing step S1603.

At step S1605, the memory device 100 may determine whether the difference between the number of first off-cells and the number of second off-cells is greater than the reference number of off-cells. When the difference between the number of first off-cells and the number of second off-cells is greater than the reference number of off-cells, step S1607 may be performed. When the difference between the number of first off-cells and the number of second off-cells is less than or equal to the reference number of off-cells, step S1609 may be performed.

At step S1607, when the difference between the number of first off-cells and the number of second off-cells is greater than the reference number of off-cells, the memory device 100 may determine a word line coupled to the plurality of memory cells to be a weak word line.

At step S1609, when the difference between the number of first off-cells and the number of second off-cells is less than or equal to the reference number of off-cells, the memory device 100 may determine the word line coupled to the plurality of memory cells to be a normal word line.

Figure 17:
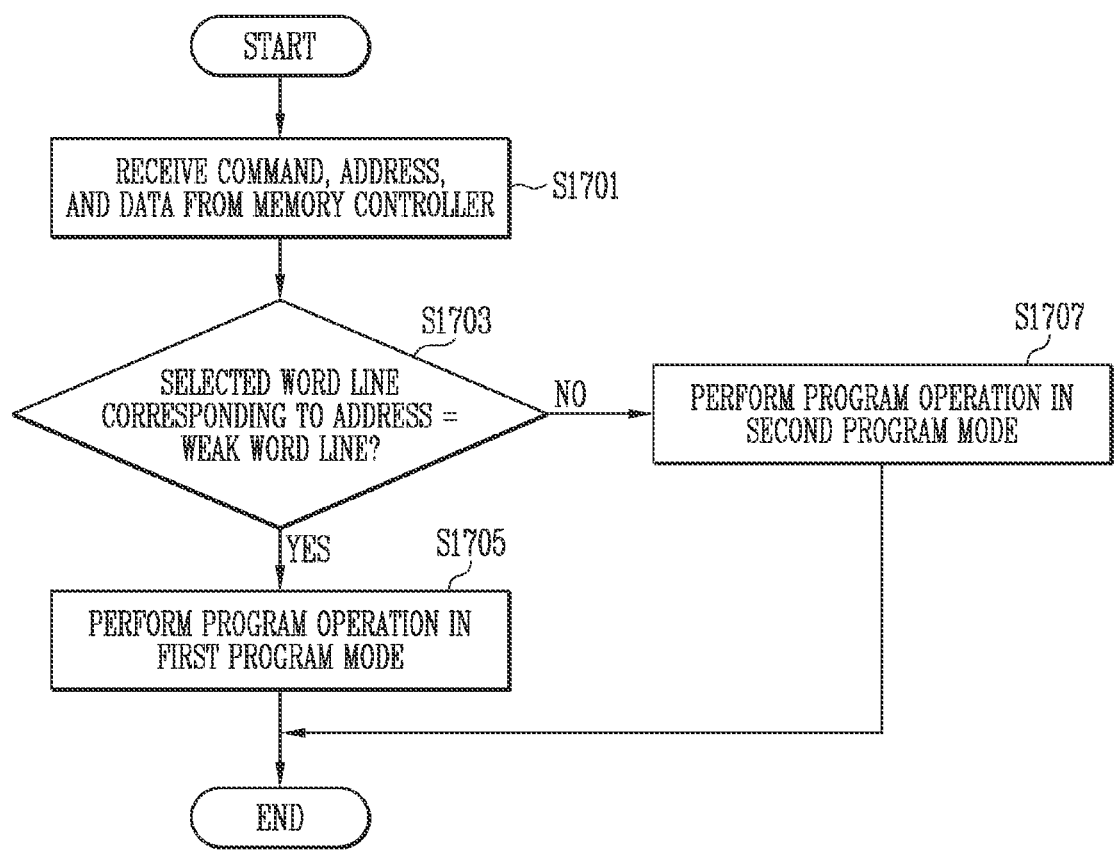
FIG. 17 is a flowchart illustrating a program operation of a memory device according to an embodiment of the present disclosure.

FIG. 17 is a flowchart illustrating a program operation of a memory device according to an embodiment of the present disclosure.

Referring to FIG. 17, at step S1701, a memory device 100 may receive a command, an address, and data from a memory controller. The command received from the memory controller may be a program command.

At step S1703, the memory device 100 may determine whether a word line corresponding to the address received from the memory controller is a weak word line by comparing word lines. The word line corresponding to the address may be a selected word line. When the word line corresponding to the address received from the memory controller is a weak word line, step S1705 may be performed. The word line corresponding to the address may be the selected word line. When the word line corresponding to the address received from the memory controller is not a weak word line, step S1707 may be performed.

At step S1705, the memory device 100 may perform the program operation in a first program mode.

At step S1707, the memory device 100 may perform the program operation in a second program mode.

Figure 18:
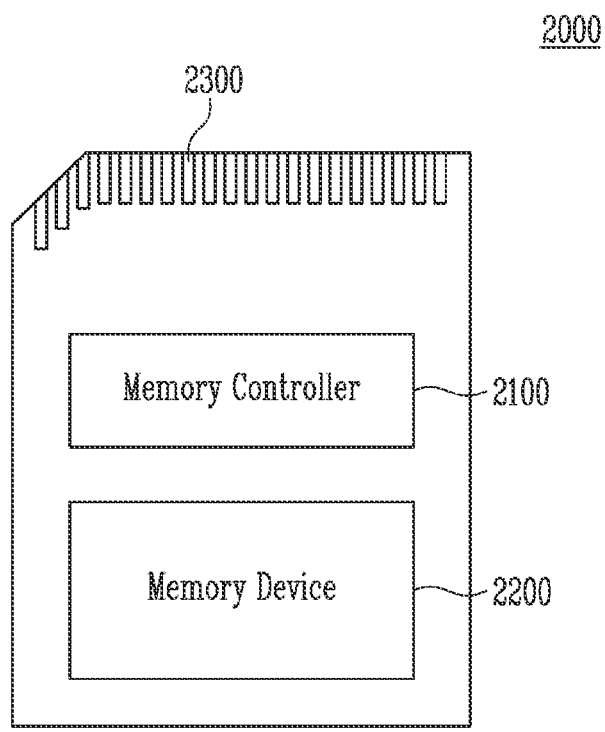
FIG. 18 is a block diagram illustrating a memory card system to which a memory system according to an embodiment of the present disclosure is applied.

FIG. 18 is a block diagram illustrating a memory card system to which a memory system according to an embodiment of the present disclosure is applied.

Referring to FIG. 18, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1. The memory device 2200 may be implemented in the same manner as the memory device 100, described above with reference to FIG. 1.

In an embodiment, the memory controller 2100 may include components, such as RAM, a processor, a host interface, a memory interface, and an error correction circuit.

The memory controller 2100 may communicate with an external device through the connector 2300. The memory controller 2100 may communicate with an external device (e.g., a host) based on a specific communication standard or protocol. In an embodiment, the memory controller 2100 may communicate with the external device through at least one of various communication standards or protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (DATA), small computer system interface (SCSI), enhanced small disk interface (ESDI), integrated drive electronics (IDE), Firewire, universal flash storage (UFS), Wi-Fi, Bluetooth, and nonvolatile memory express (NVMe). In an embodiment, the connector 2300 may be defined by at least one of the above-described various communication standards or protocols.

In an embodiment, the memory device 2200 may be implemented using any one of various nonvolatile memory types, such as Electrically Erasable and Programmable ROM (EEPROM), NAND flash memory, NOR flash memory, Phase-change RAM (PRAM), Resistive RAM (Re-RAM), Ferroelectric RAM (FRAM), Spin Transfer Torque magnetic RAM (STT-M RAM), etc.

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 19:
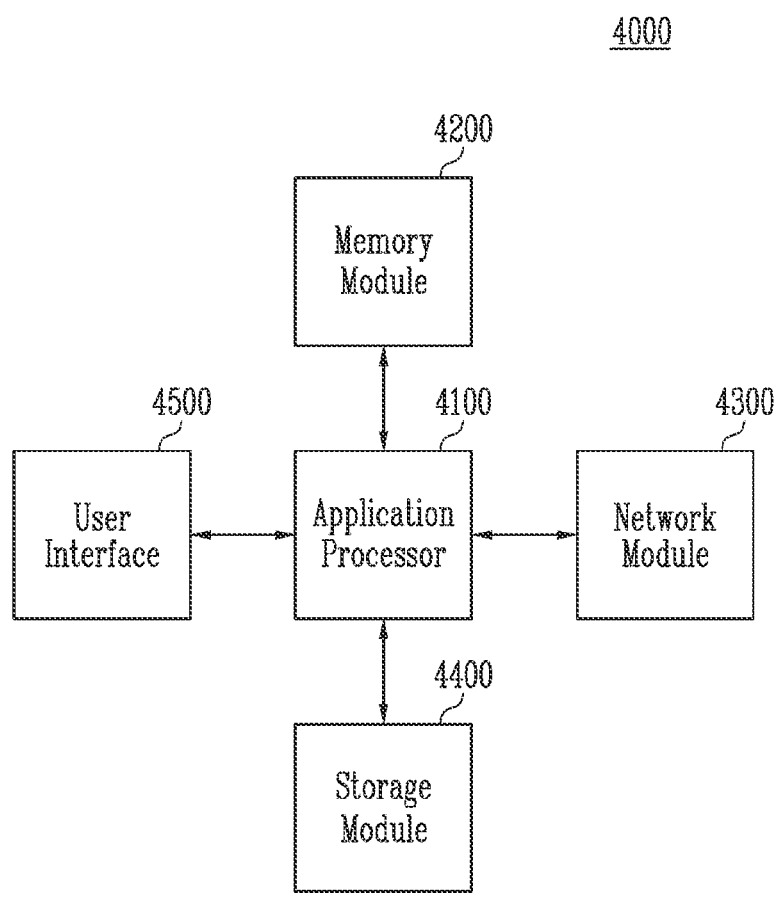
FIG. 19 is a block diagram illustrating a user system to which a memory system according to an embodiment of the present disclosure is applied.

FIG. 19 is a block diagram illustrating a user system to which a memory system according to an embodiment of the present disclosure is applied.

Referring to FIG. 19, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function to provide main memory, working memory, buffer memory or cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented using nonvolatile semiconductor memory device, such as Phase-change RAM (PRAM), Magnetic RAM (MRAM), Resistive RAM (RRAM), NAND flash memory, NOR flash memory, or NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as the memory device 100 described above with reference to FIG. 1. The storage module 4400 may be operated in the same manner as the memory system 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with an embodiment of the present disclosure, is a memory device capable of improving the threshold voltage distributions of memory cells during a program operation. Also in accordance with the present disclosure is a method of operating the memory device.

What is claimed is:
1. A memory device, comprising:
    a plurality of memory cells coupled to a plurality of word lines;
    a peripheral circuit configured to perform a word line test operation of determining a weak word line among the plurality of word lines; and
    a weak word line determiner configured to control the peripheral circuit such that a result, obtained by comparing a number of first off-cells identified through a first pre-program operation with a number of second off-cells identified through a second pre-program operation, is stored in any one memory block during the word line test operation,
        wherein the first pre-program operation is an operation of applying a precharge voltage to a source line coupled in common to the plurality of memory cells and thereafter applying a pre-program voltage to a selected word line among the plurality of word lines, and wherein the second pre-program operation is an operation of applying a ground voltage to the source line and thereafter applying the pre-program voltage to the selected word line.

2. The memory device according to claim 1, wherein the weak word line determiner is configured to control the peripheral circuit such that, when a difference between the number of first off-cells and the number of second off-cells is greater than a reference number of off-cells, result information indicating that the selected word line is the weak word line is stored in the one memory block.

3. The memory device according to claim 2, wherein the weak word line determiner is configured to control the peripheral circuit such that, when the difference between the number of first off-cells and the number of second off-cells is less than or equal to the reference number of off-cells, result information indicating that the selected word line is a normal word line is stored in the one memory block.

4. The memory device according to claim 3, wherein:
each of the first and second pre-program operations includes a pre-verify operation of identifying threshold voltages of selected memory cells coupled to the selected word line using a pre-verify voltage, and
each of the number of first off-cells and the number of second off-cells is a number of memory cells, among the selected memory cells, having threshold voltages higher than the pre-verify voltage.

5. A memory device, comprising:
a plurality of memory cells coupled to a plurality of word lines;
a peripheral circuit configured to perform a program operation of storing data in the plurality of memory cells;
a weak word line information storage configured to store information about a weak word line among the plurality of word lines; and
a program operation controller configured to control the peripheral circuit such that the program operation is performed in a first program mode or a second program mode depending on a result of determining whether a selected word line corresponding to an address provided from a memory controller is a weak word line by comparing word lines based on the information about the weak word line,
wherein the information about the weak word line includes information determined by comparing a first pre-program operation with a second pre-program operation, wherein the first pre-program operation is an operation of applying a precharge voltage to a source line coupled in common to the plurality of memory cells and increasing threshold voltages of the plurality of memory cells, and the second pre-program operation is an operation of applying a ground voltage to the source line and increasing threshold voltages of the plurality of memory cells.

6. The memory device according to claim 5, wherein the information about the weak word line includes information determined based on a result of comparing a number of first off-cells identified through the first pre-program operation with a number of second off-cells identified through the second pre-program operation.

7. The memory device according to claim 6, wherein the information about the weak word line includes information about a word line coupled to memory cells for which a difference between the number of first off-cells and the number of second off-cells is greater than the reference number of off-cells.

8. The memory device according to claim 5, wherein:
the plurality of memory cells comprise first memory cells included in a first channel region and second memory cells included in a second channel region disposed over the first channel region, and
the information about the weak word line includes information about word lines coupled to memory cells disposed in respective lower portions of the first channel region and the second channel region.

9. The memory device according to claim 5, wherein the program operation controller is configured to control the peripheral circuit such that, when the selected word line is a weak word line, the program operation is performed in the first program mode, and when the selected word line is a normal word line, the program operation is performed in the second program mode.

10. The memory device according to claim 9, wherein:
the program operation includes a plurality of program loops, and
the program operation controller is configured to control the peripheral circuit such that the precharge voltage is applied to the source line from any one of the program loops in the first program mode and such that the precharge voltage is applied to the source line from a program loop previous to the one program loop in the second program mode.

11. The memory device according to claim 9, wherein the program operation controller is configured to control the peripheral circuit such that:
in the first program mode, the precharge voltage is applied to the source line during a first period and thereafter a program voltage is applied to the selected word line, and
in the second program mode, the precharge voltage is applied to the source line during a second period shorter than the first period and thereafter the program voltage is applied to the selected word line.

12. The memory device according to claim 9, wherein the program operation controller is configured to control the peripheral circuit such that:
in the first program mode, a turn-on voltage is applied to unselected word lines, among the plurality of word lines, while the precharge voltage is applied to the source line, and
in the second program mode, a ground voltage is applied to the unselected word lines while the precharge voltage is applied to the source line.

13. The memory device according to claim 9, wherein the program operation controller is configured to control the peripheral circuit such that:
in the first program mode, a first pass voltage is applied to unselected word lines, among the plurality of word lines, while the program voltage is applied to the selected word line, and
in the second program mode, a second pass voltage, higher than the first pass voltage, is applied to the unselected word lines while the program voltage is applied to the selected word line.

14. The memory device according to claim 9, wherein the program operation controller is configured to control the peripheral circuit such that:

in the first program mode, a first pass voltage is applied to unselected word lines, among the plurality of word lines, while a program voltage is applied to the selected word line, and in the second program mode, a second pass voltage, higher than the first pass voltage, is applied to word lines adjacent to the selected word line, among the plurality of word lines, and the first pass voltage is applied to remaining word lines other than the selected word line and the word lines adjacent to the selected word line, among the plurality of word lines, while the program voltage is applied to the selected word line.

15. A method of operating a memory device, the memory device including a plurality of memory cells coupled to a plurality of word lines, the method comprising:

determining, based on information about a weak word line, whether a selected word line corresponding to an address provided from a memory controller is a weak word line by comparing the selected word line with the weak word line;

determining a program mode to be any one of a first program mode and a second program mode based on a result of the comparison; and performing a program operation of storing data in selected memory cells coupled to the selected word line based on the one program mode, wherein the information about the weak word line includes information determined by comparing a first pre-program operation of applying a precharge voltage to a source line coupled in common to the plurality of memory cells and increasing threshold voltages of the plurality of memory cells with a second pre-program operation of applying a ground voltage to the source line and increasing threshold voltages of the plurality of memory cells.

16. The method according to claim 15, wherein the information about the weak word line includes information about a word line coupled to memory cells for which a difference between a number of first off-cells identified through the first pre-program operation and a number of second off-cells identified through the second pre-program operation is greater than a reference number of off-cells.

17. The method according to claim 15, wherein determining the program mode to be any one of the first program mode and the second program mode comprises:

when the selected word line is a weak word line, determining the one program mode to be the first program mode, whereas when the selected word line is a normal word line, determining the one program mode to be the second program mode.

18. The method according to claim 17, wherein:

the program operation includes a plurality of program loops, and a number of program loops in which the precharge voltage is applied to the source line in the first program mode is less than a number of program loops in which the precharge voltage is applied to the source line in the second program mode.

19. The method according to claim 17, wherein a time period during which a channel region of the plurality of memory cells is precharged in the first program mode is shorter than a time period during which the channel region of the plurality of memory cells is precharged in the second program mode.

20. The method according to claim 17, wherein:

the first program mode includes applying a turn-on voltage to unselected word lines, among the plurality of word lines, while applying the precharge voltage to the source line, and the second program mode includes applying a ground voltage to remaining word lines other than the selected word line and word lines adjacent to the selected word line, among the plurality of word lines, while applying the precharge voltage to the source line.

* * * * *